United States Patent [19]
Nakazato et al.

[11] Patent Number: 5,677,637
[45] Date of Patent: Oct. 14, 1997

[54] LOGIC DEVICE USING SINGLE ELECTRON COULOMB BLOCKADE TECHNIQUES

[75] Inventors: Kazuo Nakazato; Haroon Ahmed; Julian D. White, all of Cambridge, United Kingdom

[73] Assignee: Hitachi, Ltd., Tokyo, Japan

[21] Appl. No.: 606,835

[22] Filed: Feb. 27, 1996

Related U.S. Application Data

[63] Continuation of Ser. No. 416,937, Apr. 4, 1995, abandoned, which is a continuation of Ser. No. 165,285, Dec. 13, 1993, abandoned, and a continuation-in-part of Ser. No. 35,835, Mar. 23, 1993, abandoned.

[30] Foreign Application Priority Data

Mar. 25, 1992 [GB] United Kingdom ............... 9206812
Dec. 18, 1992 [GB] United Kingdom ............... 9226382

[51] Int. Cl.$^6$ ............... H03K 19/23; H03K 19/00
[52] U.S. Cl. ............... 326/35; 326/136; 326/93
[58] Field of Search ............... 326/136, 56, 59, 326/35, 93, 61

[56] References Cited

U.S. PATENT DOCUMENTS

| | | | |
|---|---|---|---|
| Re. 25,867 | 9/1965 | Richards. | |
| 2,923,817 | 2/1960 | Wanlass. | |
| 3,209,163 | 9/1965 | Wendt, Jr.. | |
| 3,259,759 | 7/1966 | Giaever | 307/88.5 |
| 3,643,237 | 2/1972 | Anacker | 340/173.1 |
| 3,882,472 | 5/1975 | Smith | 340/173 |
| 3,986,180 | 10/1976 | Cade | 340/173 |
| 4,103,312 | 7/1978 | Chang et al. | 357/16 |
| 5,258,625 | 11/1993 | Kamohara et al.. | |

FOREIGN PATENT DOCUMENTS

| | | |
|---|---|---|
| 0 324 505 | 7/1989 | European Pat. Off.. |
| 0 984 233 | 2/1965 | United Kingdom. |
| 0 984 234 | 2/1965 | United Kingdom. |
| 1 051 586 | 12/1966 | United Kingdom. |
| 2 256 313 | 12/1992 | United Kingdom. |

OTHER PUBLICATIONS

Microelectronika, vol. 16, No. 3, pp. 195–209, May–Jun. 1987; K. K. Likharev, "Possibility of Creating Analog and Digital Integrated Circuits Using The Discrete, One Electron Tunneling Effect".

IBM J. Res. Develop., vol. 32, No. 1, Jan. 1988, pp. 144–157; K. K. Likharev: *Correlated discrete transfer of single electrons in ultrasmall tunnel junctions.*

Plenum Press, New York, NY, 1992, Series B: Physics vol. 294, Chapter 9: *Single Charge Tunneling;* D.V. Averin and K. K. Likharev, edited by Hermann Grabert and Michel H. Devoret.

Physical Review Letters, vol. 67, No. 22, 25 Nov. 1991; T. A. Fulton, P. L. Gammel, and L. N. Dunkleberger, pp. 3148–3150: *Determination of Coulomb–Blockade Resistances and Observation of the Tunneling of Single Electrons in Small–Tunnel–Junction Circuits.*

(List continued on next page.)

*Primary Examiner*—Edward P. Westin
*Assistant Examiner*—Richard Roseen
*Attorney, Agent, or Firm*—Kenyon & Kenyon

[57] ABSTRACT

A memory device includes a memory node (2) to which is connected a tunnel barrier configuration such that the node exhibits first and second quantized memory states for which the level of stored charge is limited by Coulomb Blockade and a surplus or shortfall of a small number of electrons for example ten electrons or even a single electron can be used to represent quantized memory states. A series of the nodes N0–N3 that are interconnected by tunnel barriers D can be arranged as a logic device. Clock waveforms V1–V3 applied to clock lines Cl 1–Cl 3 selectively alter the probability of charge carriers passing through the tunnel diodes D from node to node. An output device, typically a Coulomb blockade electrometer provides an output logical signal indicative of the logical state of node N3. Arrays of separately addressable memory cells $M_{mn}$ are also described, that utilize gated multiple tunnel junctions (MTJs) as their barrier configurations. Side gated GaAs MTJ structures formed by selective etching and lithography are described. Also, gate structures which modulate a conductive channel with depletion regions to form multiple tunnel junctions are disclosed.

49 Claims, 24 Drawing Sheets

OTHER PUBLICATIONS

C.R. Acad. Sci., Paris, t 314, Series II, pp. 883–888, 1992; P. Lafarge et al.: *Direct observation of macroscopic charge quantization: a Millikan experiment in a submicron solid state device.*

Electronics Letters, vol. 29, No. 4, 18 Feb. 1993, pp. 384–385, Nakazato et al.: *Single–Electron Memory.*

Journal of Applied Physics, vol. 72, No. 9, 1 Nov. 1992, New York, US: pp. 4399–4413, J. R. Tucker: *Complementary Digital Logic Based on the "Coulomb Blockade".*

Applied Physics Letters, vol. 60, No. 22, Jun. 1992, New York, US, pp. 2726–2728; J. Allam et al.: *Optical second–harmonic generation in laterally asymmetric quantum dots.*

Applied Physics Letters, vol. 59, No. 18, Oct. 1991, New York, US, pp. 2302–2304; C. Sirtori et al.: *Observation of large second order susceptibility via intersubband transitions at lambda = 10 microns in asymmetric coupled AlInAs/GaInAs quantum wells.*

Applied Physics Letters, vol. 52, No. 9, Feb. 1988, New York, US, pp. 697–699; L. Tsang et al.: *Electric–field control of optical second–harmonic generation in a quantum well.*

IRE Transactions On Electronic Computers, Jun. 1961, pp. 183–190; H.S. Yourke et al.: *Eskaski Diode NOT–OR Logic Circuits.*

*Coulomb Blockade of Single–Electron Tunneling, and Coherent Oscillations in Small Tunnel Junctions;* Journal of Low Temperature Physics, vol. 62, Nos. 3/4, 1986, D.V. Averin & K.K. Likharev.

*Frequency–Locked Turnstile Device for Single Electrons;* Physical Review Letters, vol. 64, No. 22, 28 May 1990; L.J. Geerlings et al.

*Observation of the Coulomb Blockade of Tunneling in a "Single Electron Box";* pp. 55–73, Thesis by Hugues Pothier, University of Paris, 16 Sep. 1991.

*Single–Electron Transistors: Electrostatic Analogs of the DC Squids;* IEEE Translations on Magnetics, vol. MAG–23, No. 2, Mar. 1987; K.K. Likharev.

*Possible Logic Circuits Based on the Correlated Single–Electron Tunneling in Ultrasmall Junctions;* K.K. Likharev and V.K. Semenov, Department of Physics, Moscow State University, Moscow, RU, pp. 182–185, 1987 International Superconductivity Electronics Conference (ISEC '87), Aug. 28, 1987.

$$\delta = \frac{C_1 + C_2}{2C_0}$$

○ = Empty of electron.

n = electron number on this node n = 0          n = 1

AND and EXOR (Exclusive OR) circuit

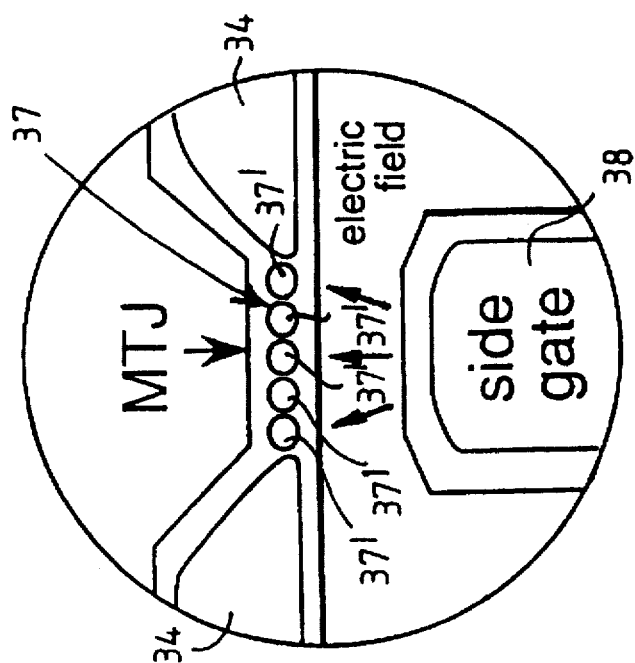
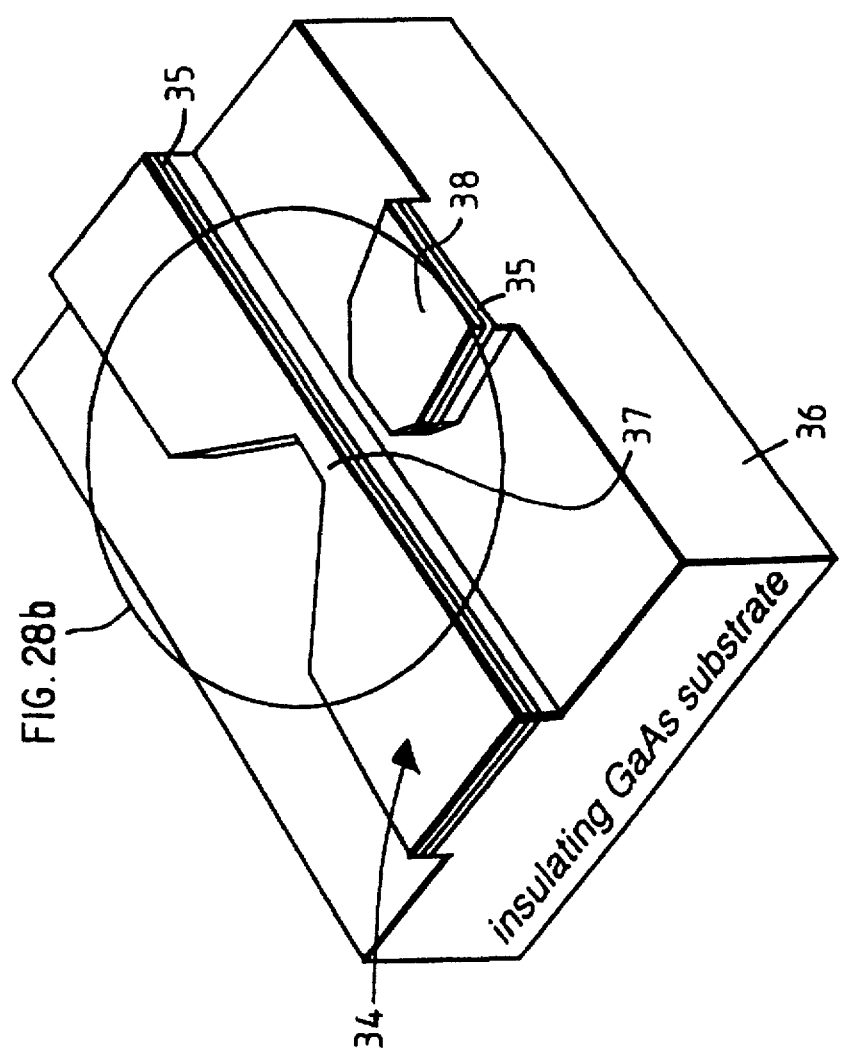

write '0'    write '1'

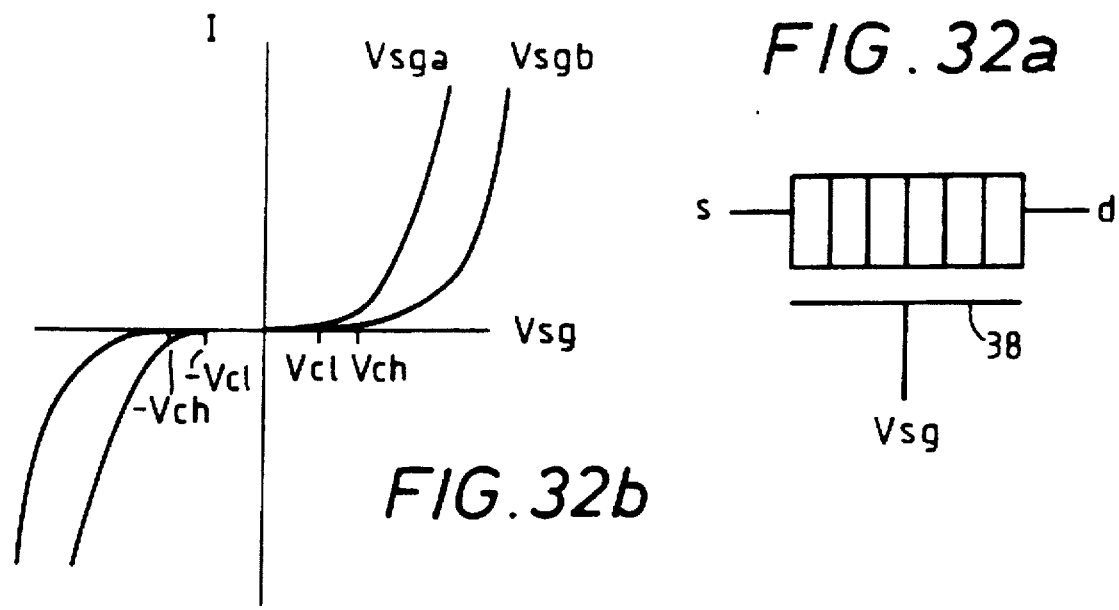
FIG. 32a
FIG. 32b
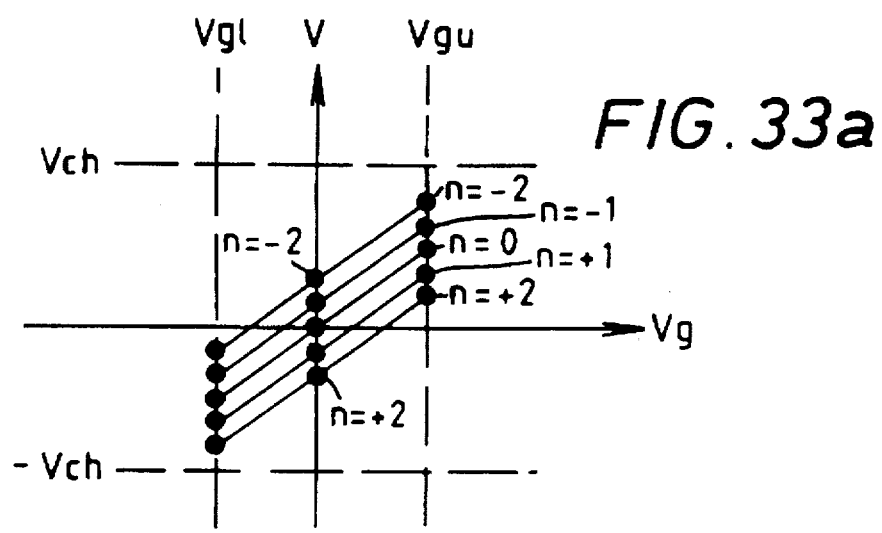
FIG. 33a
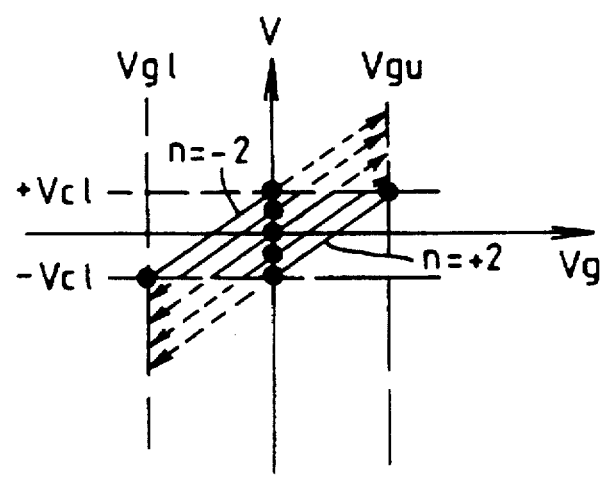
FIG. 33b

- Poly-Si
- Metal1
- Metal2
- Insulator
- ⊠ Contact hole between top and the underneath layers

- Poly-Si
- Metal1
- Metal2
- Insulator
- ⊠ Contact hole between top and the underneath layers

LOGIC DEVICE USING SINGLE ELECTRON COULOMB BLOCKADE TECHNIQUES

This application is a continuation of application Ser. No. 08/416,937 filed 4 Apr. 1995 now abandoned, which is a continuation of application Ser. No. 08/165,285, filed 13 Dec. 1993, abandoned, and a CIP of application Ser. No. 08/035,835 filed 23 March 1993 now abandoned.

FIELD OF THE INVENTION

This invention relates to improved memory device, which can be used as a logic device.

BACKGROUND TO THE INVENTION

Conventional semiconductor devices utilise transistors in which one bit of information is carried by typically $10^5$ electrons. In principle, information can be transmitted by only one electron, binary unity/zero being coded by the presence or absence of a single-electron in a certain metallic or semiconductor region. If a logic device is realised in which one or a small number of electrons represents one bit of information, power dissipation of such a device will be reduced by $10^{-5}$ compared to present day semiconductor devices.

Since Averin and Likharev pointed out the possibility of macroscopic charge quantization [D. V. Averin and K. K. Likharev, "Coulomb blockade of the single-electron tunnelling, and coherent oscillation in a small tunnel junctions", J. Low Temp. Phys. 62, p345 (1986)], many research efforts have revealed that the motion of a single electron can be controlled. [L. J. Geerligs et al, "Frequency-Locked Turnstile Device for Single Electronic", Phys. Rev. Lett. 64, p2691, (1990), P. Lagarge et al, "Direct observations of macroscopic charge quantization", Z. Phys. B-Condensed Matter 85, p327, (1991)] Single-electron transistor [K. K. Likharev, "Single-electron transistors: electrostatic analogues of the DC SQUIDS", IEEE transactions on magnetism, MAG-23, p1142 (1987)] and several kinds of single-electron logic circuits [K. K. Likharev and V. K. Semenov, "Possible Logic Circuits based on the correlated single-electron tunnelling in ultrasmall junctions", Ext. Abstr. of ISEC '87, Tokyo, p182, 1987] have been proposed, but these devices cannot operate at high speed because the single electrons are transmitted randomly in time, so it takes a long time to obtain reliable transmission of information.

It is an object of the invention to transmit electron states in a well-controlled in time sequence.

It is another object of the present invention to provide a memory cell that uses a Coulomb Blockade to control the electron number at a memory node, which can be controllably and reliable shifted between stable electron storage states, and which can form a building block for arrays of such cells, which can be addressed individually.

SUMMARY OF THE INVENTION

In accordance with the invention the memory device includes a memory node which exhibits first and second quantized memory states, wherein the level of charge at the node is limited by Coulomb Blockade, and control means is provided to control the probability of charge tunnelling through the barrier means during a predetermined period, to produce a transition between the memory states at the node.

The control means can comprise clocking means for permitting the transition to occur only during a predetermined clocking period. The clocking period may be periodic or aperiodic. Thus, carrier flow is controlled to a predetermined clocking period to ensure reliable transmission of information.

In a first embodiment of the invention, a plurality of the memory nodes are coupled in series, and the clocking means is operative to pass the memory states of the nodes successively from node to node. Lines of the nodes can be cross-coupled or branched to perform logic functions, so that the invention can provide a logic device.

In a second embodiment, the node is utilised in a memory cell, and a plurality of the cells can be configured in an array. The cells may be individually addressable for reading and writing operations. The barrier means for the or each cell may be provided with gate means for providing a field which influences the tunnel barrier configuration. The control means for the cell may include first and second means for applying respective control potentials to the barrier configuration, to switch the state of the memory node in response to predetermined combination of the control potentials.

BRIEF DESCRIPTION OF THE DRAWINGS

In order that the invention may be more fully understood embodiments thereof will now be described by way of example, with reference to the accompanying drawings in which:

FIGS. 28a and 28b represent a schematic illustration of the structure of MTJ1 of FIG. 26;

FIG. 32a illustrates the source/drain voltage versus current characteristic for the multiple tunnel junction device shown in FIG. 32b;

FIG. 33a is a graph of the memory node voltage V as a function of the gate voltage $V_g$ for a high value of the Coulomb Blockade threshold limit $V_{Ch}$ when a write pulse $B_W$ is applied to the cell, to show that no data is written;

FIG. 33b corresponds to FIG. 33a, but with a lower Coulomb Blockade threshold limit $V_{Cl}$, for demonstrating that data is written into the cell in response to write pulse $B_W$;

DESCRIPTION OF EMBODIMENTS

Figure 1:
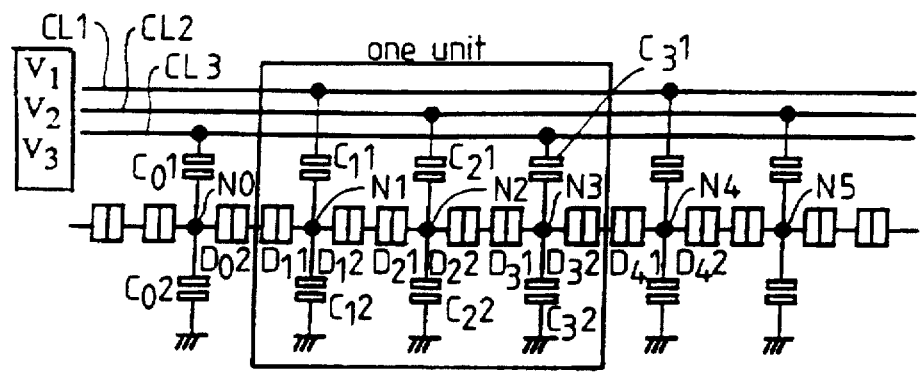
FIG. 1 is a schematic circuit diagram of a logic device in accordance with the invention which includes a sequential chain of logic nodes.

Referring to FIG. 1, a first embodiment of the invention is shown schematically and consists of a device for sequential transfer of digital information between successive nodes arranged in a line. By way of example, the digital information is represented by the presence or absence of a single electron at a particular node, e.g. the presence of electron e=1; absence of an electron e=0, although generally, the states 1 and 0 can be represented by the presence and absence of a small number n of electrons.

The nodes are referenced N0, N1, N2, N3, N4, N5 in FIG. 1. Information is clocked between the nodes N0,–N5 by the application of cyclic clock signals of different phases $V_1$, $V_2$, $V_3$, on clock lines CL1, CL2, CL3. It will be seen that the nodes N1–N3 are connected in series with nodes N0 and N4, N5. In this embodiment, the nodes N1–N3 can be considered to define a single logic unit within the node sequence.

Each node is connected to a respective clock line CL by a capacitor C1 and is connected to earth through capacitor C2. Thus, the node N1 is connected to clock line CL1 by capacitor C1 1, and to earth through capacitor C1 2.

The nodes are interconnected by pairs of tunnel diodes connected in series. Thus, node N1 is connected in series with node N2 through tunnel diodes D1 2 and D2 1. Similarly, node N2 is connected to node N3 through tunnel diodes D2 2 and D3 1.

By applying appropriate cyclic clocking signals $V_1$, $V_2$, $V_3$ to the clock lines CL1, CL2, CL3, the electron state of node N1 can be transferred to node N2, and, the state of node N2 can be transferred to node N3, with the state of node N3 being transferred to node N4. The level of charge established in each of the nodes is limited by Coulomb Blockade, as will be explained in more detail hereinafter, so that for each node, only two electron states can exist i.e. the presence of an electron (logical state 1) or the absence of an electron (logical state 0). These two states are each stable and hence the node exhibits internal memory, since each node can be clocked from a 1 to a 0 state and vice versa.

In the unitary logic cell (nodes N1–N3) node N1 constitutes an information node and nodes N2, N3 constitute transfer nodes which act as buffer storage. The information node N1 can, at the start of one complete clocking cycle, have an electron state equal 1 or 0, whilst the transfer nodes N2, N3 are empty i.e. at state 0. As a result of applying the clocking voltages $V_1$, $V_2$, $V_3$, the information of node N1 is firstly transferred into node N2 and then to N3. At the start of the next clocking cycle, the state of N3 is transferred to node N4 which constitutes the information node of the next logic unit in the sequence.

As previously mentioned, the electron flow between the nodes is limited to one electron by a phenomena known as Coulomb Blockade. As discussed by Geerligs et al supra it has been found that a simple tunnel junction which is characterised by a very small capacitance can exhibit Coulomb Blockade. For a capacitor of capacitance C, the energy that needs to be imparted to a single electron $\Delta E_c$ to force the electron into the capacitor is the charging energy of a single electron which is given by $$\Delta E_c = \frac{e^2}{2C} \qquad (1)$$

where e is the charge on the electron. If the capacitor is very small, this quantity can become significant in comparison with the energy supplied by the external voltage source of magnitude V, which is eV. If the condition $\Delta E_c > eV$ is satisfied, no current can pass through the device, and this is known as Coulomb Blockade of single electron tunnelling.

Thus, referring to FIG. 1, the clocking voltages V1–V3 are selected so that bias conditions are established between adjacent nodes across the interconnecting tunnelling diodes to cause electron tunnelling from one node to the next, but such that only one electron can tunnel through the diodes between the nodes. Further electron tunnelling is inhibited by Coulomb blockade. As shown in FIG. 1, two tunnel diodes are provided between each node. Thus, for example between the node N1 and N2, two tunnel diodes D1 2 and D2 1 are provided. It can be shown that once an electron has tunnelled through a first of the diodes an energy selection process occurs and as a result, the electron can tunnel on through the second diode and the presence of two junctions provides for multiple stable states at each node N, which gives rise to an internal memory effect at the node.

Figure 2:
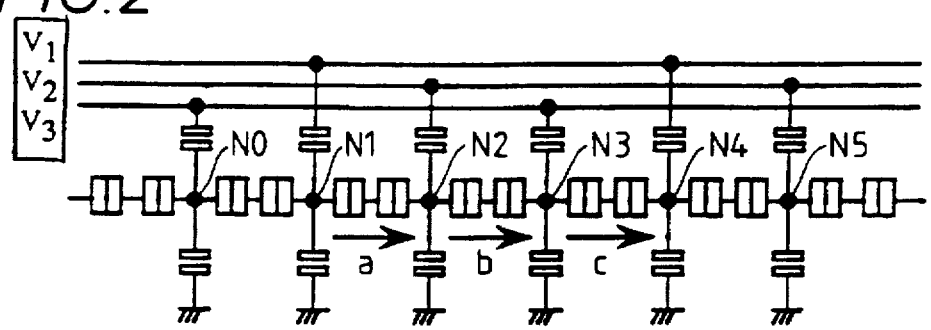
FIG. 2 is a circuit diagram, similar to FIG. 1, for explaining operation of the device.
Figure 3A:
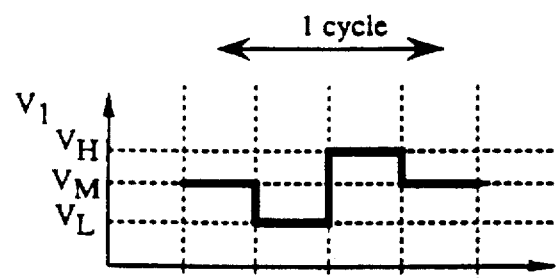
FIGS. 3A–3C shows clocking waveforms applied to the clocking lines of FIG. 2.
Figure 3B:
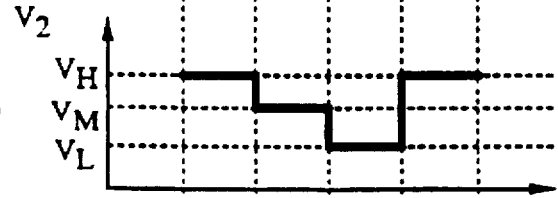
Figure 3C:
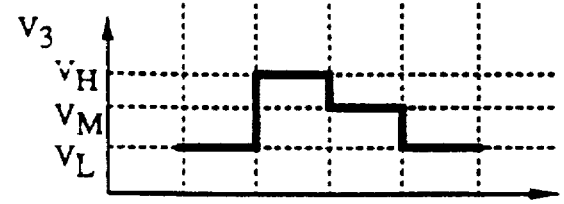

Referring to FIG. 2, this shows schematically the circuit of FIG. 1, in which the states of nodes N1, N2, N3 are shown as a states a, b, c, respectively. In FIGS. 3a, b, c, the clocking waveforms $V_1$, $V_2$, $V_3$ are shown schematically. Each of the clocking waveforms is switched cyclically in the manner shown between a middle, high and low voltage $V_H$, $V_M$, $V_L$. The waveform is selected so as to apply appropriate bias voltages between adjacent nodes to cause electron transfer thereby transferring the states a, b, c in the manner shown in FIG. 2.

This will be explained in more detail with reference to FIGS. 4, 5 and 6.

Figure 4:
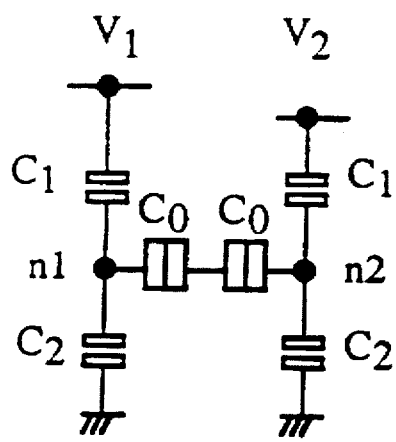
FIG. 4 illustrates schematically two nodes of the device shown in FIG. 1 for use in explaining permissible electron states thereof.

Referring to FIG. 4, this shows schematically the two nodes N1, N2. In this analysis, it is assumed that the capacitor C1 for each node is of the same value. Likewise, it is assumed that capacitor C2 for each node is of the same value. The capacitance associated with the tunnel diodes D12 and D2 1 are considered equal and of a value C0. The number of electrons on each of the nodes N1, N2 is designated n1, n2 respectively.

The electron state of the system shown in FIG. 4 is denoted as (n1, n2). Thus, for example (1, 0) means that one electron occupies the left node N1 (n1=1) and an electron is absent from the node N2 (n2=0).

Figure 5:
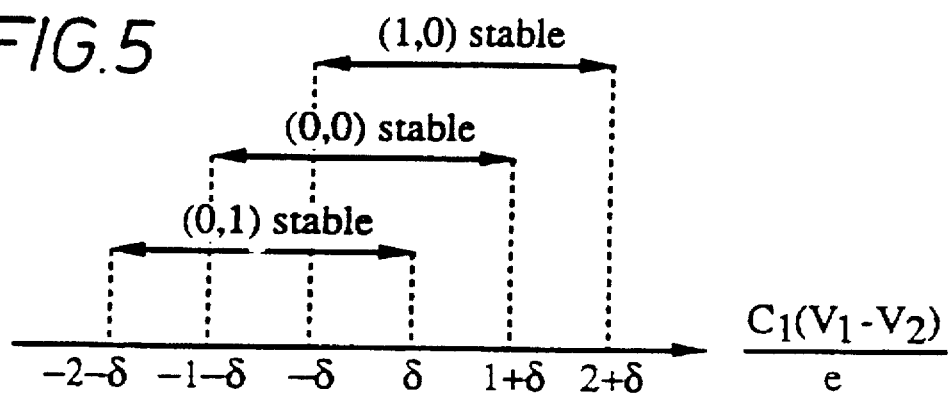
FIG. 5 is a schematic representation of permissible electron states of the device shown in FIG. 4.

FIG. 5 is a plot of the stable electron states associated with the system shown in FIG. 4. The drawing shows a plot of $C1(V_1-V_2)/e$, which is indicative of the difference between the electron states of nodes N1 and N2. The range of stable states can be characterised in terms of a factor $\delta$ where:

$$\delta = \frac{C1 + C2}{2C0} \qquad (2)$$

Figure 6:
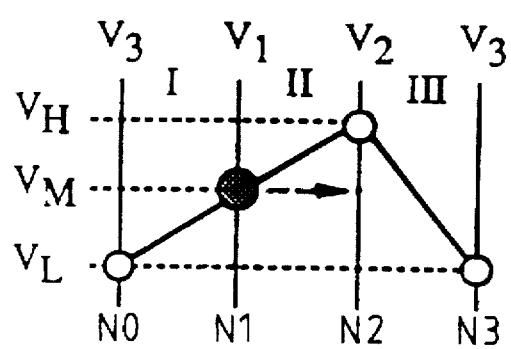
FIG. 6 illustrates schematically the effect of the clocking waveform on adjacent nodes in the device of FIG. 1.

Referring now to FIG. 6, this shows schematically the three different bias voltage levels $V_L$, $V_M$, $V_H$ that can be applied to each of the nodes N0, N1, N2, N3 by means of the clocking waveforms $V_1$, $V_2$, $V_3$.

Considering the electron state of the node N1, it is desired to shift this electron state progressively to the right i.e. to node N2 etc.

Thus, for nodes N1 and N2, there are three successive conditions that need to be satisfied, which can be expressed as follows:

requirement

I  (1,0) unstable   $\delta < \frac{C_1(V_M - V_L)}{e} < 1 + \delta$ (0,0) stable II (1,0) unstable   $\delta < \frac{C_1(V_H - V_M)}{e} < 1 + \delta$ (0,0) and
   (0,1) stable III (0,0) and       $\delta < \frac{C_1(V_H - V_L)}{e} < 1 + \delta$ (1,0) unstable
    (0,0) unstable By substituting typical value capacitances in the in equalities given above, it is possible to compute appropriate values for $V_H$, $V_L$ and $V_M$ that will achieve an appropriate sequential electron state transfer between the sequence of nodes.

Figure 7:
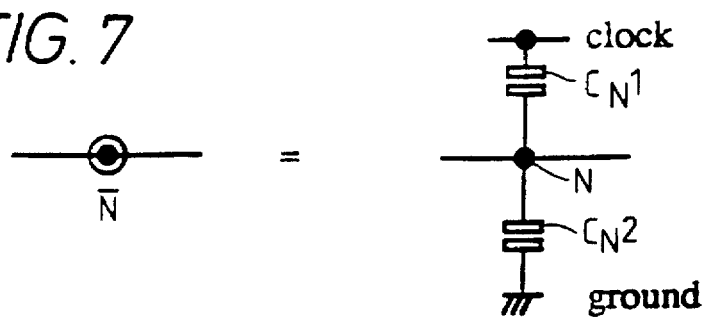
FIG. 7 illustrates a node symbol used in the drawings herein.
Figure 8:
FIG. 8 illustrates the circuit of FIG. 1 using the node symbol of FIG. 7.

In FIG. 7, a new symbol N is defined in order to represent the node N and its associated capacitors and clocking lines. Thus, using the new notation, the circuit of FIG. 1 can be represented as shown in FIG. 8. This provides an essentially one-dimensional array, which permits sequential information transfer. However, the circuitry can be expanded into two or multi-dimensional arrays to perform logic functions.

Figure 9:
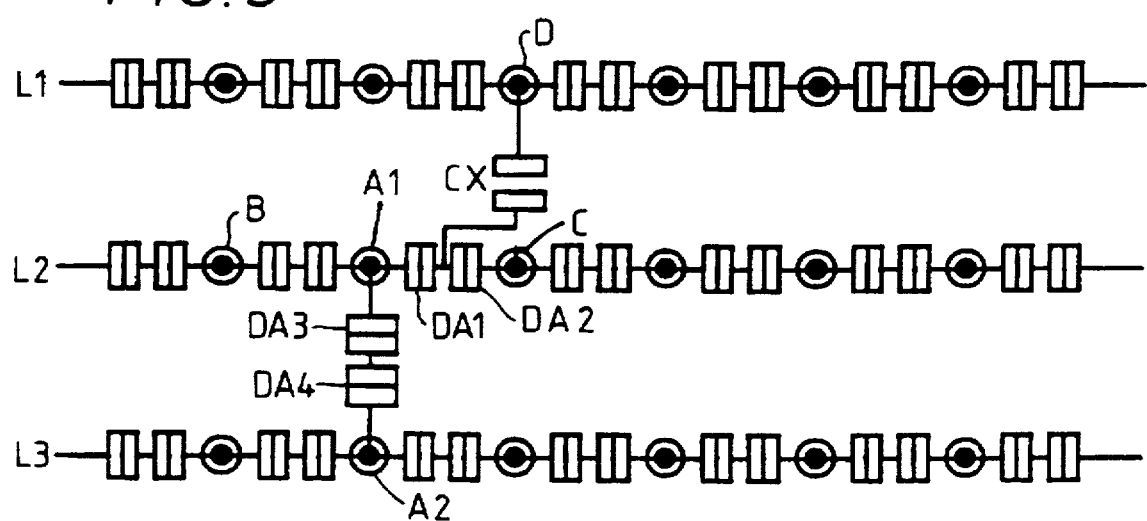
FIG. 9 is a schematic circuit diagram of a logic device in accordance with the invention in the form of a two dimensional array.
Figure 10:
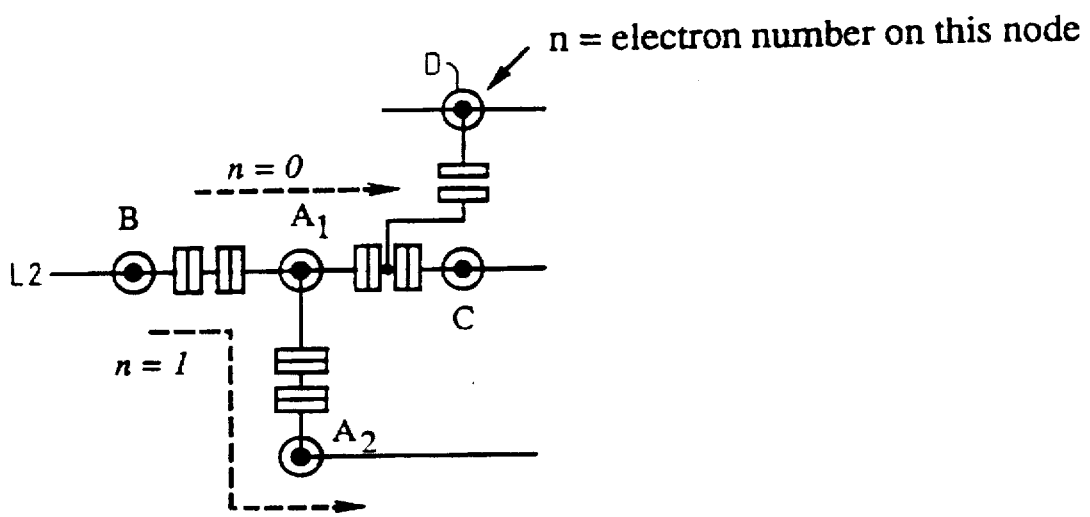
FIG. 10 illustrates operation of certain nodes within the array of FIG. 9.

An example of a two-dimensional array is shown in FIG. 9. Three parallel linear arrays of nodes L1, L2, L3 are provided. In this example, a capacitive coupling CX is provided between node D in line L1 and a connection between tunnel diodes DA1 and DA2. Node A1 in line L2 is coupled to node A2 in line L3 by a pair of tunnel diodes DA3 and DA4. The cross coupling between the lines is to perform logic functions since the electron occupancy of the nodes are cross coupled between the lines as will now be explained in more detail with reference to FIG. 10. Considering the electron state, of node D, n represents the electron number on the node. When n=0, the state of node D does not influence the state of node A1 and as a result, logical information is transferred along line L2 from node B to node A1 and then to node C sequentially in the manner described with reference to FIG. 1.

However, when an electron is present at node D on line L1 (n=1) a potential is applied through capacitor CX and tunnel diode DA1 to the node A1, with the result that Coulomb blockade occurs. Accordingly, when the electron state of node B is clocked (as described with reference to FIG. 1) in the direction of node A1, an unstable state occurs at node A1 so that the electron state of node B is transferred through tunnel diodes DA3 and DA4 to node A2. Thus, data from line L2 is switched to line L3 depending on the electron state of node D in line L1.

Figure 11:
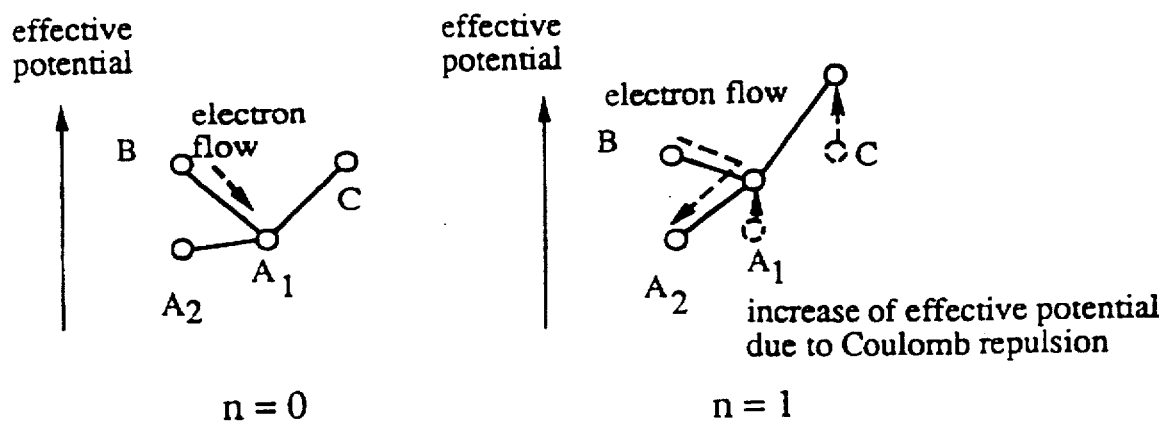
FIG. 11 illustrates potentials occurring in the configuration of FIG. 10.

This is shown schematically in FIG. 11, which illustrates the effective potential for the various nodes for the two different states of node D i.e. n=0 and n=1. The effective potential shown in FIG. 11 is given by $$\text{effective potential} = -\frac{C_1}{e} V_{clock} + \frac{Q_{ind}}{e} \qquad (3)$$

$V_{clock}$ = clock voltage $Q_{ind}$ = induced charge by surrounding electrons

Figure 12:
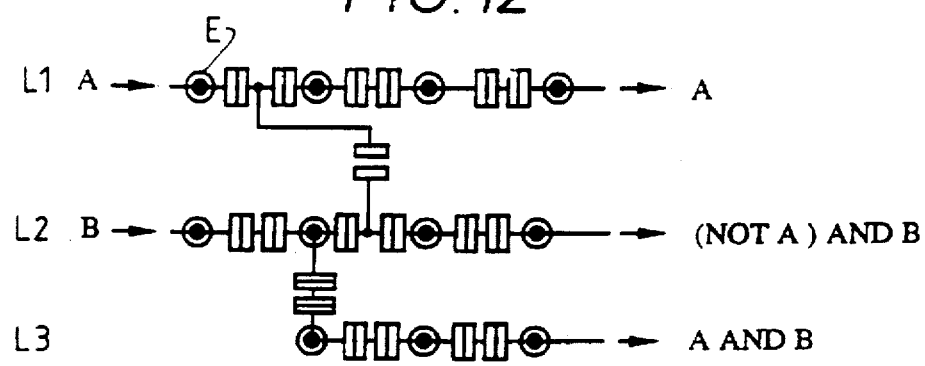
FIG. 12 illustrates an array that forms an AND and a NOT circuit.

Much more complicated logical circuits can be produced. Referring to FIG. 12, an AND and NOT circuit is shown which, in response to logical inputs A and B on lines L1, L2, produces output A on line L1, (NOT A) AND B on line L2, and A AND B on line L3. The three lines L1, L2, L3 are clocked in synchronism in the manner described with reference to FIG. 1. The presence of an electron on node E of line L1 inhibits by Coulomb Blockade the passage of signals on line L2 and diverts a signal from line L1 and line L2 to line L3.

Figure 13:
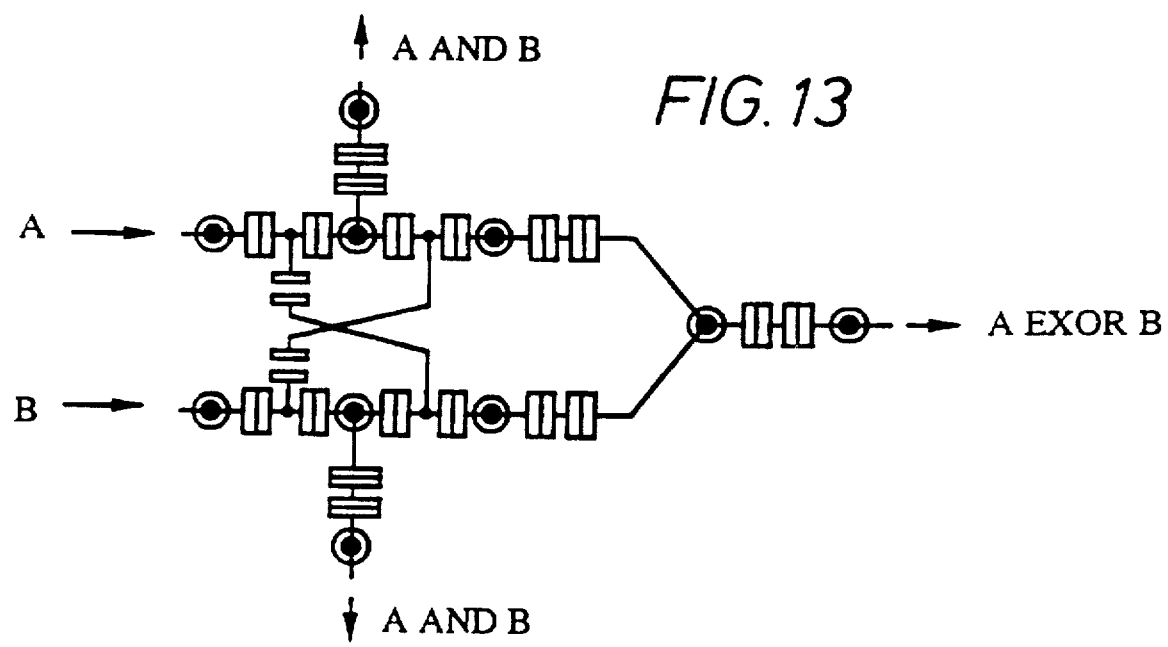
FIG. 13 illustrates an AND and an EXOR (Exclusive OR) circuit.

FIG. 13 shows another form of logic circuit which provides an AND and an EXOR (Exclusive OR) circuit. In response to inputs A, B, the circuit provides outputs in the manner shown in the drawing as will be evident to those skilled in the art in view of the foregoing description.

Figure 14:
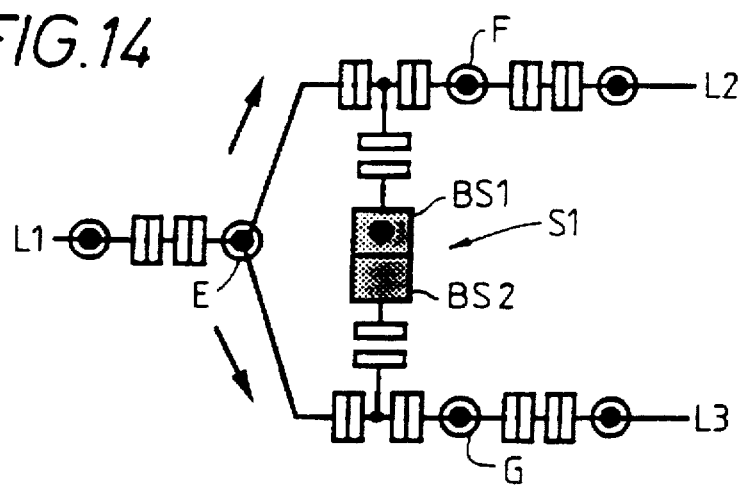
FIG. 14 illustrates a bistable switch.

FIG. 14 shows an example of a switch. An input on line L1 can be switched between lines L2 and L3 depending on the state of a switching element S1 connected between the lines L2, L3. The switch S1 conveniently comprises an asymmetrical quantum dot configuration as described in U.S. Pat. No. 5,291,034. The switching device can be considered as a bistable arrangement responsive to input optical radiation to switch its electron state between two bistable conditions. In FIG. 14, the switch S1 is illustrated schematically to have first and second bistable electron states BS1, BS2 such that, for example, in response to input radiation, an electron can be considered to be held in state BS1 whereas in another condition, e.g. the absence of light, the electron can be switched into state BS2. When in state BS1, the electron produces a blocking effect for the passage of charge between node E and node F i.e. rendering the electron state of node F unstable so that electrons are preferentially clocked from node E to node G. Thus, data from line L1 is switched to line L3. The converse situation occurs when the switch S1 has its electron state switched to state BS2. Therefore, the circuit of FIG. 14 operates as a switch so that data flowing on line L1 can be selectively switched to line L2 or L3 depending on the state of switch S1.

Figure 15:
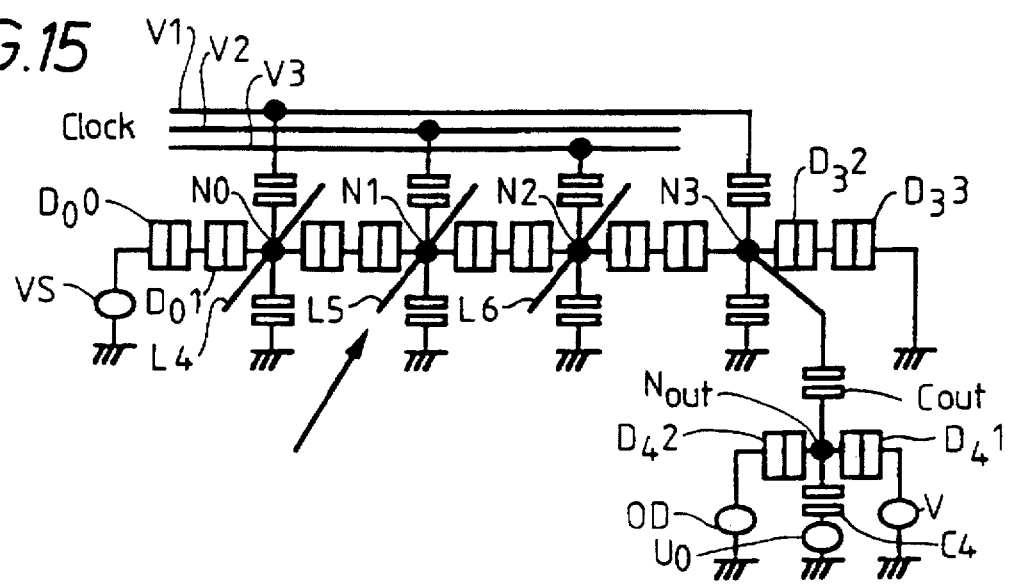
FIG. 15 is a schematic circuit diagram of a logic device according to the invention including voltage source and an output unit.

Referring now to FIG. 15, this shows a sequence of logic units as described with reference to FIG. 1 in more detail, with a voltage source and an output device, in order to explain in a more practical way how the device can be used to perform logical operations.

Single electrons from a voltage source $V_S$ pass through a pair of tunnel diodes D0 0, D0 1 to a first of the nodes N0 and then sequentially to nodes N1, N2, N3 as previously described with reference to FIG. 1, under the control of clocking voltages $V_1$, $V_2$, $V_3$. The node N3 is connected through a pair of tunnel diodes D3 2, D3 3 to earth so that the electron state of N3 is sequentially clocked to earth and the circuit operates in the manner of a shift register.

The electron states of the nodes N0–N3 are controlled in a manner (for example as described with reference to FIG. 9) so as to control the electron occupancy of the nodes. Thus, input logical control states are applied transversely on lines L4, 5, 6, to determine whether the stream of electrons sequentially clocked along the device are permitted to reside at the nodes during the clocking sequence. Thus, the coupling through the lines L4–L6 can change the stream of electron states that is sequentially clocked along the device. The resulting presence or absence of an electron (representing logical 1 and 0) is detected at the node N3 by an output device in the form of a Coulomb Blockade electrometer. The electron occupancy of node N3 is detected through a capacitor $C_{out}$ connected to a node $N_{out}$ connected between a tunnel diode pair D4 1–D4 2. The node $N_{out}$ is biassed by a voltage source U0 through a capacitor C4. The electrometer is voltage biassed with a source V near its Coulomb gap e/C' where C' is the combined capacitance of the tunnel diodes D4 2 and D4 1. The node is also charged biassed near e/4 by means of U0. Under these conditions, the electrometer current I varies linearly with small variations of the charge on the capacitance $C_{out}$ and the current is measured by an output device OD. For a further discussion of a Coulomb Blockade electrometer, reference is directed to D. V. Averin and K. K. Likaroy J. Low Temp. Physics 62, 345 (1986) and T. A. Fulton and G. J. Dolan, Physics Review Letters 59, 109 (1987).

Figure 16:
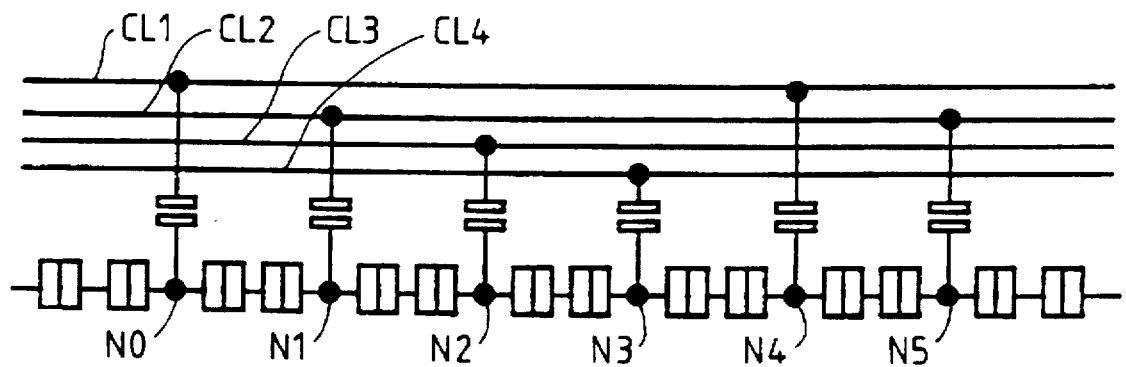
FIG. 16 illustrates a modification of the logic device utilising four clock waveforms.

Many modifications fall within the scope of the invention and many different logical combinations of the clocked nodes described herein will be apparent to those skilled in the art in view of the foregoing. In order to provide a more practical circuit, it may be desirable to utilise a 4-clock system rather than the 3-clock waveforms described hereinbefore. An example of a 4-clock system is shown schematically in FIG. 16. Also, it is possible to achieve the desired stable node states by the omission of capacitor C2 associated with each node N. This is also shown in FIG. 16.

A practical form of device including the nodes, tunnel diodes and capacitors described hereinbefore will now be discussed in relation to FIGS. 17 and 18. The device consists of a substrate 10 with an overlaying insulating layer 11 in which are formed a plurality of conductive tracks that define the nodes tunnel diodes and capacitors shown for example in FIG. 1.

Figure 17:
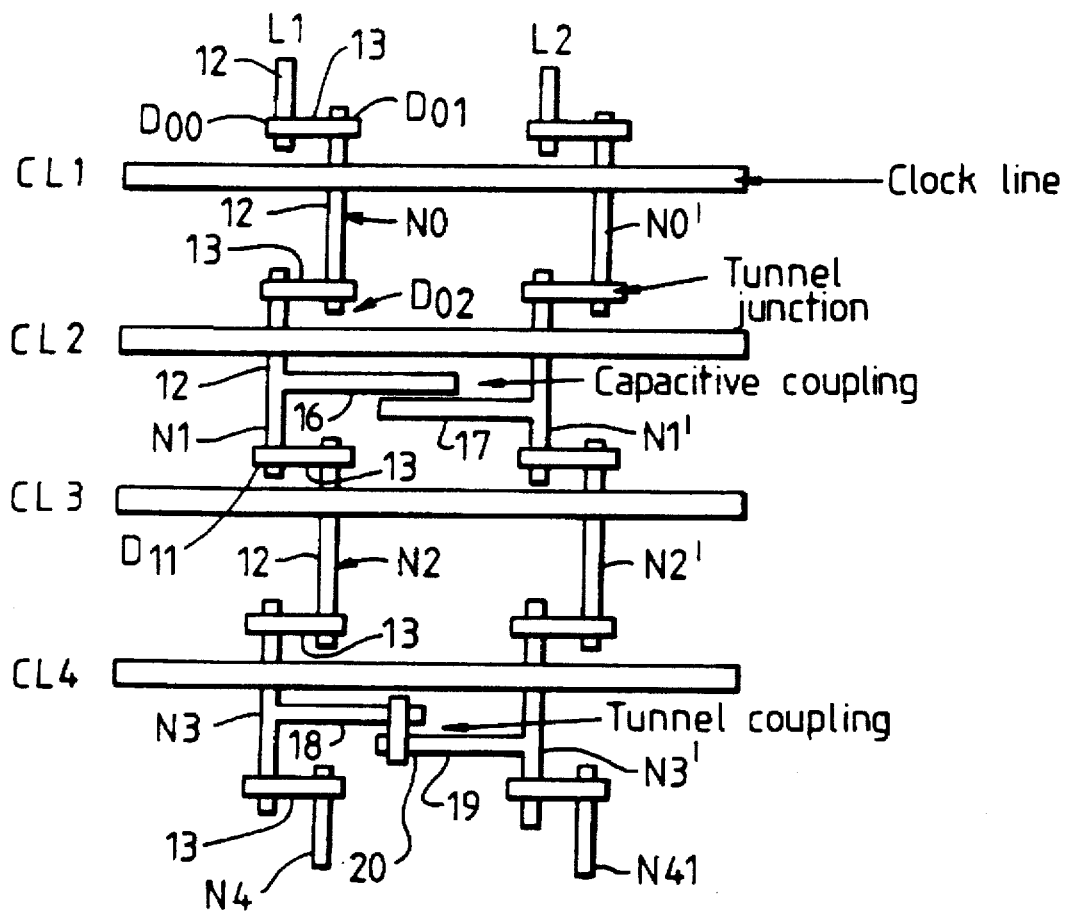
FIG. 17 is a plan view of an integrated circuit structure of a logic device according to the invention.
Figure 18:
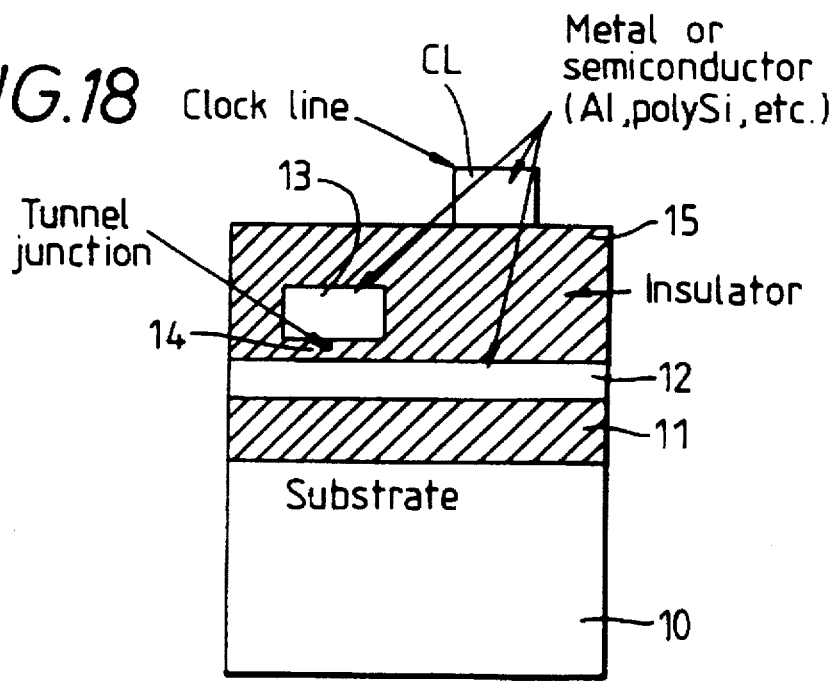
FIG. 18 is a schematic partial cross sectional view of the device shown in FIG. 17.

Referring to FIG. 17, the device consists of two parallel lines of nodes L1, L2 which are operated by four clock waveform lines CL1, 2, 3, 4. Considering the line L1, nodes N0–N4 are formed by a plurality of parallel conductive channels 12, overlying the insulation layer 11 (shown in FIG. 18). The tunnel junctions D are formed by an overlying conductor e.g. the conductor 13 shown in FIG. 18, which is spaced from conductor 12 by a very thin layer of the insulator, referenced 14. Thus, the regions where the conductor 13 bridges the conductors 12 constitute tunnel diodes regions with a very small value of capacitance so as to provide the Coulomb Blockade effects previously described. The various conductors 13 are covered by insulator 15 and the clock lines CL are formed on the surface thereof. The clock lines are capacitively coupled to the lines 12 through the insulator 15, which acts as a dielectric so as to define the capacitors C1 shown in FIG. 1. The insulator 11 may act as a dielectric between the conductors 12 and the substrate 10 so as to form the capacitors C2, if required. The various layers shown in FIG. 18 can be formed in a number of different ways. Typically, the substrate 10 is of silicon and the insulator comprises silicon dioxde. The conductive tracks 12, 13 and CL can be formed of a metal or a semiconductor such as polysilicon. The conductive channels 12, 13 can be formed by electron beam lithography.

Two logical interconnections between the lines L1 and L2 are shown in FIG. 17. The nodes N1 of the lines L1 and N1' of L2 are interconnected by conductive tracks 16, 17 that are spaced apart by a region of the insulator 15 that forms a dielectric. Thus, the region of overlap between the tracks 16, 17 forms the capacitor such that the electron state of the node N1 of line L1 influences the electron state of the corresponding node in line L2.

Also, the nodes N3 and N3' of the adjacent lines L1 and L2 are interconnected by a pair of tunnel diodes. The nodes N3 and N3' are connected to respective conductive tracks 18, 19 that are bridged by a further conductor 20 corresponding in structure to conductor 13 of FIG. 18. Thus, the conductors 18, 19, 20 form a pair of tunnel diodes so as to form a Coulomb Blockade coupling between the nodes N3 and N3'.

Figure 19A:
FIGS. 19A–19C is illustrative of symbology for multi-tunnel junctions (MTJs)

Some further modifications and variations will now be described. In the foregoing embodiments, the nodes N are interconnected by pairs of tunnel junctions connected in series. However, further tunnel junctions can be used for each series connection and an increase can reduce errors due to the so-called co-tunnelling effect. Such a structure is known as a multiple tunnel junction (MTJ) and is conventionally represented by the symbol shown in FIG. 19a. A discussion of techniques for forming MTJs is given in Nakazto, K., Thornton, T. J., White J., and Ahmed, H.: "Single-electron effects in a point contact using a side-gating in delta-doped layers", Appl. Phys. Lett., 1992, 61, No. 26.

Figure 19B:
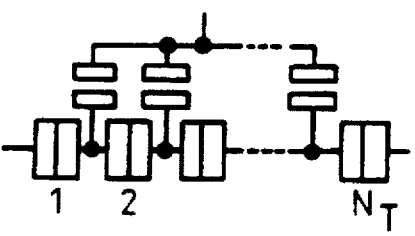
Figure 19C:
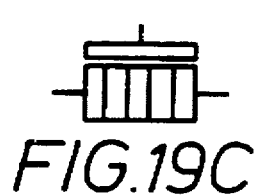

From Nakazato et al supra, it will be seen that side-gated structures can be produced with the circuit configuration as shown in FIG. 19b and a symbol for such a circuit configuration is shown in FIG. 19c.

Figure 20:
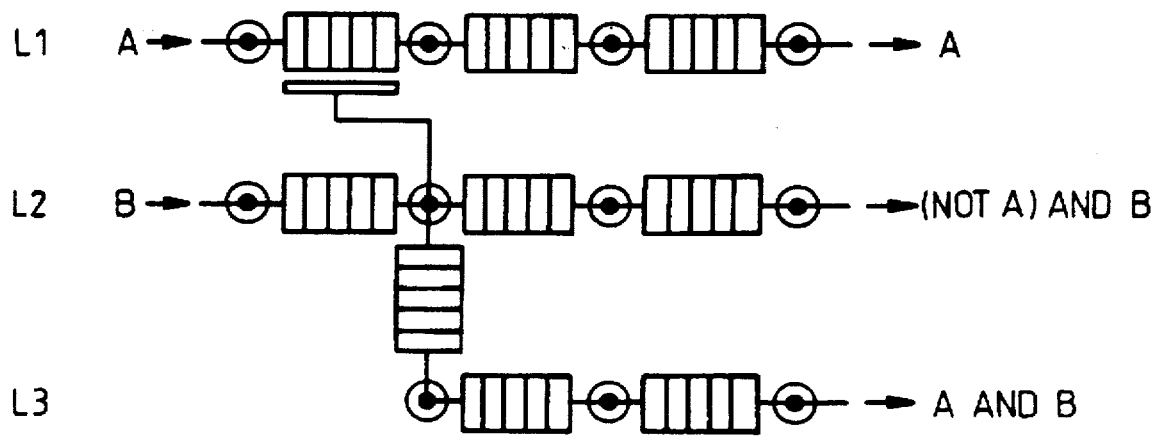
FIG. 20 illustrates a modification to FIG. 12, using MTJs.

Thus, the previously described circuits can be modified to use MTJs. Referring for example to FIG. 20, this shows the circuit of FIG. 12, modified to include MTJs. It will be appreciated that corresponding modifications can be made to the circuits shown in the other preceding Figures.

Figure 21:
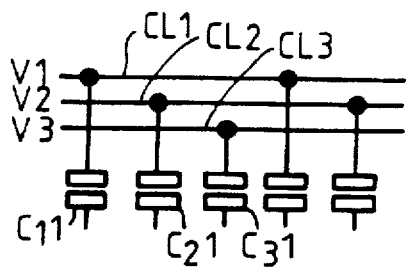
FIGS. 21 and 22 illustrate a modification to the clocking lines using a strip line arrangement.
Figure 22:
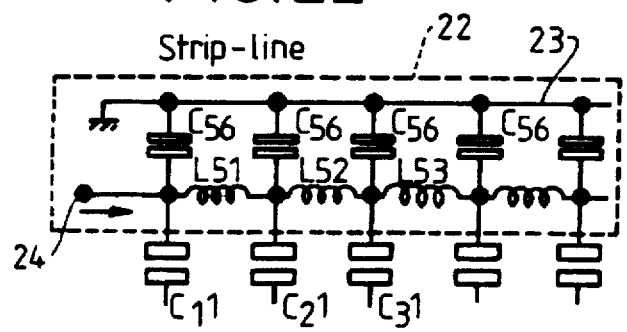
Figure 23:
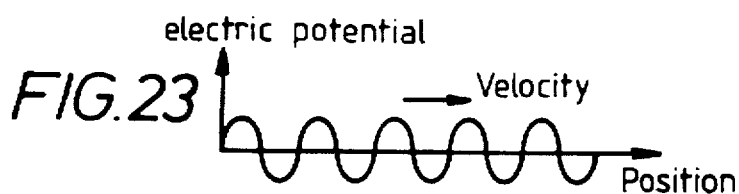
FIG. 23 is a schematic graph of the potential transmitted along the strip line.
Figure 24:
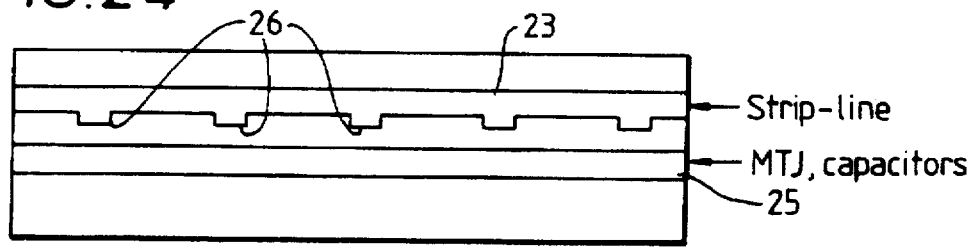
FIG. 24 is a schematic sectional view of a device according to the invention, with a strip line according to FIG. 22.

In another modification, the three or four phase clocking lines can be replaced by a strip line along which a time-dependent electric wave propagates. This can simplify the device structure. Thus, referring to FIG. 21, this shows a detail of FIG. 1 illustrating the three clock lines CL1-3 that apply the clocking waveforms V1-3 to capacitors C1 1, C2 1 and C3 1. FIG. 22 shows an alternative arrangement in which a potential wave is transmitted along a strip-line to achieve the time-varying clocking potentials. FIG. 23 shows the waveform transmitted along the strip-line and FIG. 24 is an illustrative section of a substrate including such a strip-line.

Referring to FIG. 22, the capacitors C1 1, C2 1 and C3 1 that in turn are connected to the sequence of Nodes N1-N3, are connected to a strip-line shown within dotted outline 22. The strip-line consists of a lossy conductive strip that provides an inductive coupling Ls1, Ls3 between the capacitors C1 1, C2 1, C3 1 etc. The strip also exhibits a capacitance illustrated by capacitive elements Csl to an earth rail 23. Thus, in use, a time varying potential is applied to input terminal 24 so that a wave is transmitted along the strip line 22 as shown in FIG. 23. As a result, waveforms corresponding to the clocking waveforms V1-3 are produced, but with a much simpler construction. Referring to FIG. 24, the strip-line 22 can comprise a lossy conductive layer formed to overlie a layer of MTJs and capacitors 25, which defines the nodes N, the structure 25 being formed in accordance with the techniques disclosed by Nakazato et al supra. The layer 23 may include local regions 26 which define localised capacitive couplings with the layer 25.

Figure 25:
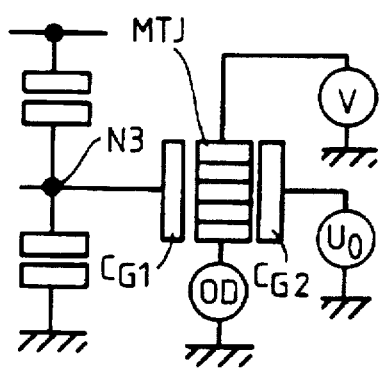
FIG. 25 shows an alternative form of electrometer.

FIG. 25 shows a modification to the electrometer used to detect the output electron state, which can be used instead of the electrometer shown in FIG. 15. In this arrangement, a multi-tunnel junction diode arrangement MTJ1 is provided with side gates Cg1 and Cg2 connected to the node N3 and to a voltage source U0 respectively. MTJ1 is also connected to a voltage source V and an output OD is taken, as shown in the Figure.

Whilst in the foregoing embodiments, the logic levels at the nodes N are defined by the presence or absence of a single electron, it will be appreciated that it is possible to use more than one electron to represent one bit of information, for example ten electrons. The electron flow is still however controlled by Coulomb Blockade and such an arrangement may expand the operational range of the circuits but will require a modification of the device parameters such as capacitors and voltage.

In the examples of the invention described so far, electron states are passed sequentially from node to node. In the following embodiments, the internal multiple memory state capability of an individual memory node is considered in more detail for use in a memory cell, and arrays of the cells are described, configured to be addressable individually for data reading and writing operations.

Figure 26:
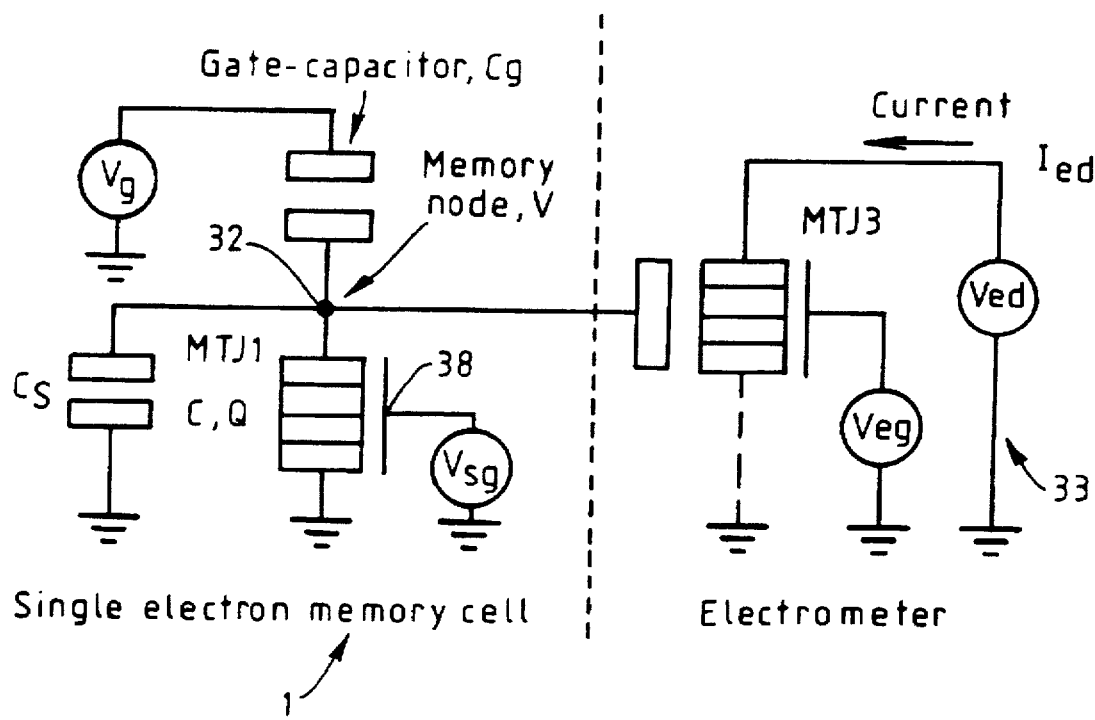
FIG. 26 is a schematic circuit diagram of a nanofabricated memory cell connected to an electrometer, in accordance with the invention.

Referring to FIG. 26, a memory device in accordance with the invention includes a memory cell 31 with a memory node 32. The voltage V of the memory node 32 is detected by an electrometer 33.

The memory cell 31 includes a side gated multiple tunnel junction device MTJ1 in series with a gate capacitor $C_g$, connected to a source of gate voltage $V_g$. The side gate of MTJ1 is connected to a source of side gate voltage $V_{sg}$. The voltage V at the memory node 32 depends both on the voltage $V_g$ applied to the gate capacitor and also the charge stored on the node 32. Electron transfer to and from the node 32 is possible only through the multiple tunnelling junction MTJ1. As will be explained in more detail hereinafter, a multiple tunnel junction device can be considered as a number of series connected tunnelling junctions. As previously discussed, the term multiple tunnel junction device (MTJ) means a device with more than two tunnelling junctions and the passage of single electrons through MTJ1 is prevented by Coulomb Blockade when the modulus of the charge $|Q|$ on one side of this device is less than a critical charge Q i.e. when $-Q_c < Q < Q_c$ where the critical charge is given by $$Q_c = \frac{eC}{\Sigma C} \frac{(1+\Delta)}{2} \quad (4)$$

Here $\Sigma C$ is the total capacitance $C+C_g+C_s$, where C is the capacitance of the MTJ1, $C_g$ is the gate capacitance, and $C_s$ is the stray capacitance; $\Delta$ determines a multi-state condition given by $$\Delta = \frac{(N_T - 1)}{N_T} \frac{(C_g + C_s)}{C} \quad (5)$$

where $N_T$ is the number of tunnel junctions in MTJ1. The voltage V at the memory node is given by $$V = \frac{e}{\Sigma C} \left( \frac{C_g V_g}{e} - n \right) \quad (6)$$

where n is the number of excess electrons on the node.

Figure 27:
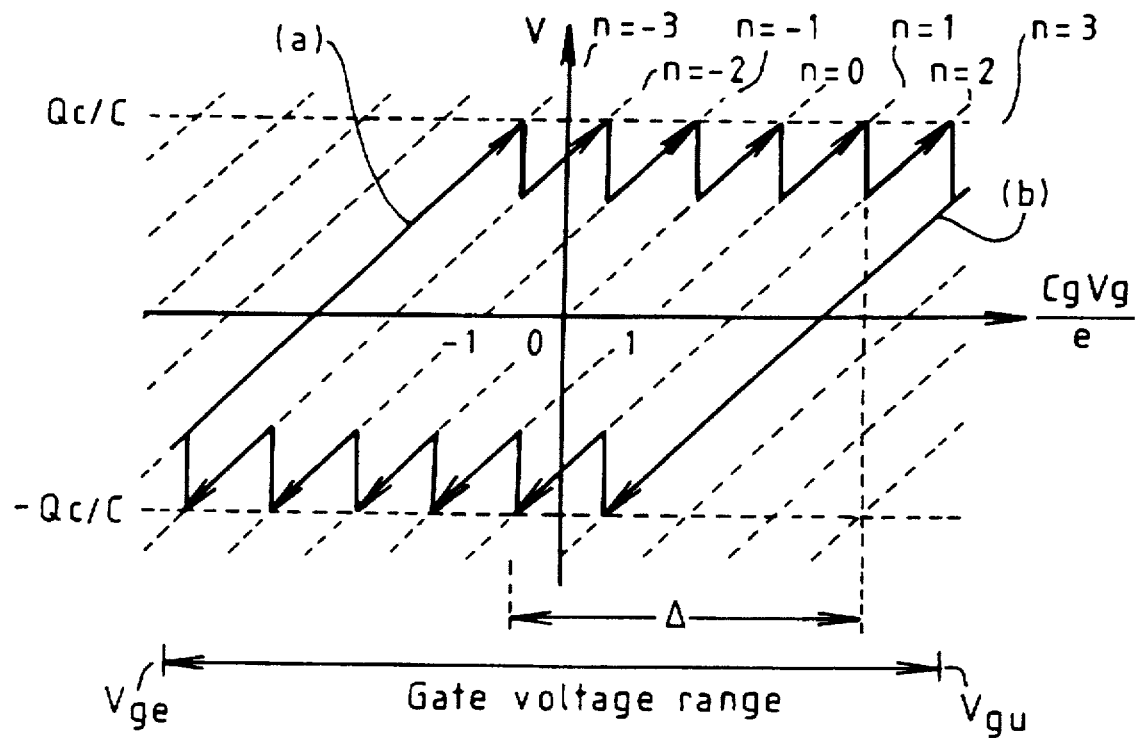
FIG. 27 is a graph illustrating the principle of operation of the device shown in FIG. 1 wherein the voltage on the memory node of the memory cell is plotted as a function of gate voltage, for cyclic operation with n electrons on the memory node.

Equation (6) is plotted in FIG. 27 and consists of a series of parallel lines for different values of n, shown in dotted outline. Within a Coulomb Blockade regime, $-Q_c/C<V<Q_c/C$, electrons cannot enter or exit the memory node 32 and the upper and lower limits of the voltage V of the memory node 32 that are set by Coulomb Blockade, $\pm Q_c/C$, are shown by chain lines in FIG. 27. When V reaches the boundary of this Coulomb Blockade regime, one electron enters or leaves to keep the energy of the node 32 inside the Coulomb Blockade region. By applying a gate-voltage pulse $V_g$ with magnitude larger than $e\Delta/Cg$, the number of electrons on the memory node can be changed as will be explained in more detail hereinafter.

The resulting characteristic exhibits hysteresis and is represented by the solid line shown in FIG. 27. Considering when the gate voltage is increased from the lowest value $V_{g1}$ of the range shown in FIG. 27, the characteristic moves along line (a) for which n=−3 (a shortfall of 3 electrons at the node 32) until the memory node voltage reaches the Coulomb Blockade limit $Q_c/C$. The node 32 then gains an electron by virtue of the Coulomb Blockade effect, so the characteristic jumps to the line for n=−2, since the node voltage V is limited by Coulomb Blockade. As the gate voltage is progressively increased to $V_{gu}$, its upper value, the electron state of the memory node progressively increases stepwise until a surplus of 3 electrons becomes established on the node 2, i.e. n=3. If the gate voltage $V_g$ is then decreased, the voltage at memory node 2 decreases along line (b) for n=3, until the lower Coulomb Blockade limit $-Q_c/C$ is reached, whereafter the electron state of the node changes stepwise to n=−3 as the gate voltage is reduced to its lower limit $V_{g1}$.

When the gate voltage $V_g$ is at zero, the node 32 can thus assume one of two stable states, for which, as shown in FIG. 27, in this example, n±2, and this can be used as a memory.

In general, one bit of information can be represented by +n and −n electron number states, where n is given by the integer part of $(\Delta+1)/2$. If the capacitances are chosen to satisfy the condition $\Delta<1$, a binary code can be represented by the presence or absence of a single electron.

A practical form of the memory cell 1 will now be described with reference to FIG. 29. In order to utilise the Coulomb Blockade effect, the structures must be made sufficiently small to make the charging energy larger than the thermal energy; the charging energy is proportional roughly inversely to the linear dimension. To realise a suitable very small structure, a side-gate structure in δ-doped GaAs material may be used, as shown in FIG. 28. An elongate electron channel 34 is formed in a δ-doped layer 35 which is situated 30 nm below the surface of a GaAs substrate 36 and is a few atomic layers in thickness. The layer 35 is typically doped with Si to a concentration of $5\times10^{12}$ cm$^{-2}$ and the various layers are grown by MBE or MOCVD techniques. In both processes, the thickness of the dopant layer can be introduced into only one atomic layer, and the resulting material is said to be δ?-doped—see Nakazato, et al supra. A fine side-gated constriction 37 with a spaced side gate 38 is defined by electron beam lithography and wet etching to a depth of 120 nm to form the junction MTJ1. The resistance of the junction is controllable since the application of a negative voltage to the side gate 38 changes the electron Fermi energy and repels the electrons from the edge of the electron channel.

As a specific example of the process parameters, the MTJ was formed by an etched constriction with a mask width of 500 nm and length of 200 nm. The mask width at the narrowest part (i.e. side-gate to channel separation) was 300 nm. The pattern was defined by electron beam (EB) lithography and wet-etching. The EB exposure was performed on a 150 nm thick polymethylmetacrylate (PMMA) coated on the δ-doped GaAs wafer. After exposure, a 30 sec development process with a weak developer (methyl-isobutylketone: isopropylalcohol=1:5) was made in order to develop only the strongly exposed regions. After 20 sec $O_2$ plasma etch to remove residual resist, the δ-doped GaAs layers were etched using an $H_3PO_4$: $H_2O_2$: $H_2O$=1:2:40 solution. The depth of the trench was controlled to 120 nm by adjusting the etch-time.

FIG. 28b is a schematic enlarged view of the construction 37 of the MTJ shown in FIG. 28a. It has been found that the characteristics of the MTJ can be explained by considering the conductive channel 34, in the region of the constriction 37, to comprise a plurality of conductive islands 37', between which electrons can tunnel, with the charge of the individual islands being limited by Coulomb Blockade. It can be shown that the sum of the effects of the individual islands 7' gives rise to a multiple tunnel junction. It is postulated that the tunnel barriers between the individual islands are produced by channel impurities.

Figure 29:
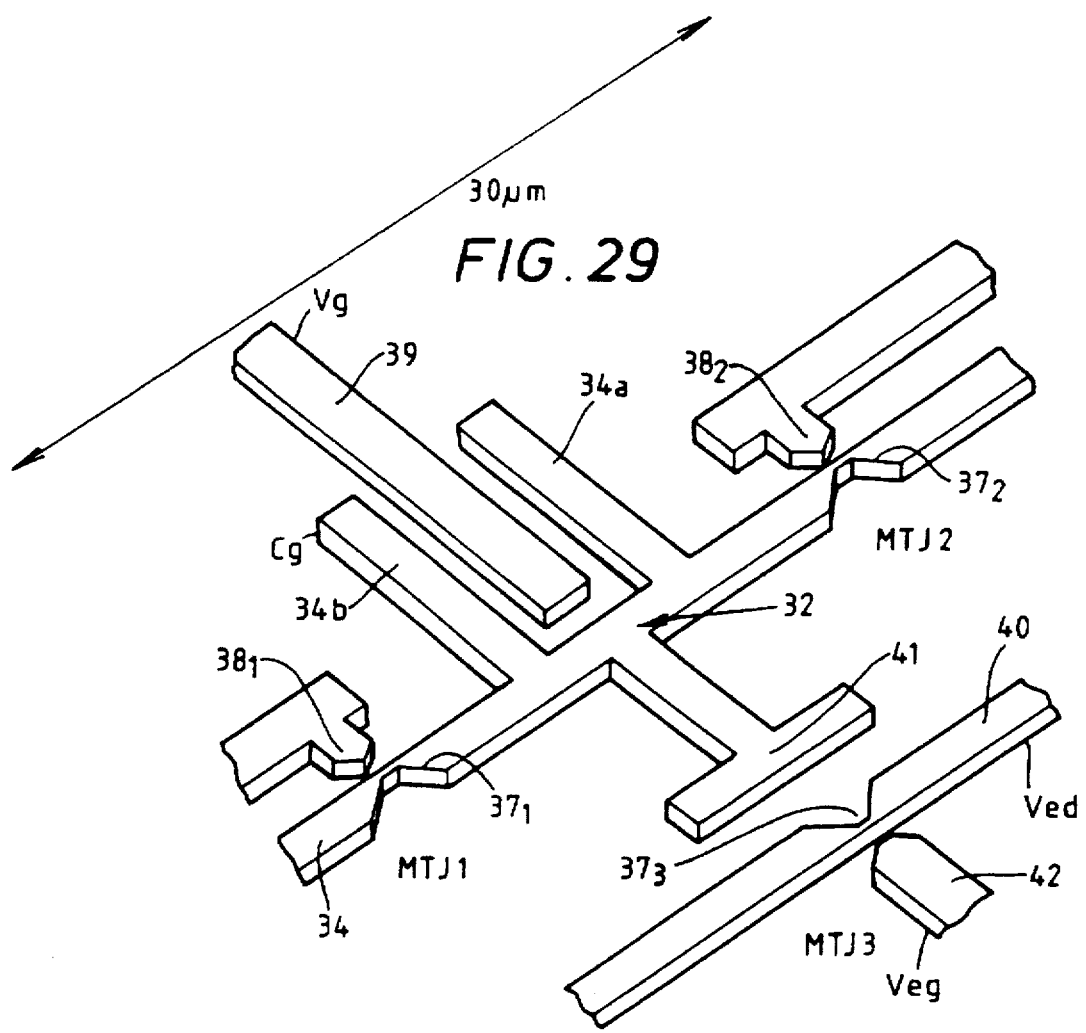
FIG. 29 is a bird's eye view (derived from a scanning electron micrograph) of a practical arrangement corresponding to the circuit of FIG. 26.

The same fabrication process can be used to produce the Coulomb Blockade electrometer 33 that detects the voltage on the memory node 32, as will become apparent from the following description of FIG. 29.

In FIG. 29, a scanning electron micrograph of a single-electron memory device corresponding to FIG. 26, is shown. All of the components are formed by etching a δ-doped substrate according to the principles previously described. The dimensions of the configuration shown in FIG. 29 are typically 30×30 μm. The memory cell 31 incorporates two multiple tunnel junctions MTJ1, MTJ2, fabricated as previously described, connected in series each with a respective constriction $37_1$, $37_2$ and side gate $38_1$, $38_2$. The additional junction MTJ2 is for calibrating MTJ1, as will be described later.

The memory node 32 is provided at the series connection between the junctions MTJ1 and MTJ2 in the channel 34. The gate voltage is applied on channel 39 which cooperates with channel extensions 34a, b in the region of the memory node 32, to define the gate capacitor $C_g$. The electrometer MTJ3 includes a multi-tunnel junction fabricated in the same way as MTJ1 and MTJ2, with a source/drain channel 40 formed from the δ-doped layer, including a constriction $37_3$ having two associated side gates 41, 42. The gate 41 controls the source/drain current in the channel 40 as a function of the voltage V of the memory node 32. The gate 42 permits a bias voltage $V_{eg}$ to be applied so that the electrometer can be biased to a linear operating region, such that the source-drain/current $I_{ed}$ increases linearly with an increase in the node voltage V.

By applying a side-gate voltage to the side gate $38_1$ to make the resistance of MTJ2 low, the characteristics of MTJ1 can be measured for calibration purposes—see Nakazato et al—supra. After such characterisation, MTJ2 is cut-off by applying a large negative voltage to its side gate $38_2$. In a specific example, the voltages applied to the gate $38_1$, $38_2$, of MTJ1 and MTJ2 are $V_{sg1}$=−2→−4 V and $V_{sg2}$=−3.5 V (which produced cut-off). For electrometer MTJ3, suitable voltages are $V_{ed}$=20 mv and $V_{eg}$≈1.3–2 V, to produce a linear response in which the source/drain current $I_{ed}$ typically ranges over 5–20 nA, in response to changes in the voltage V of the memory node 32.

The memory cell characteristics may be investigated by varying the gate voltage $V_g$ and monitoring the electrometer current $I_{ed}$.

Figure 30:
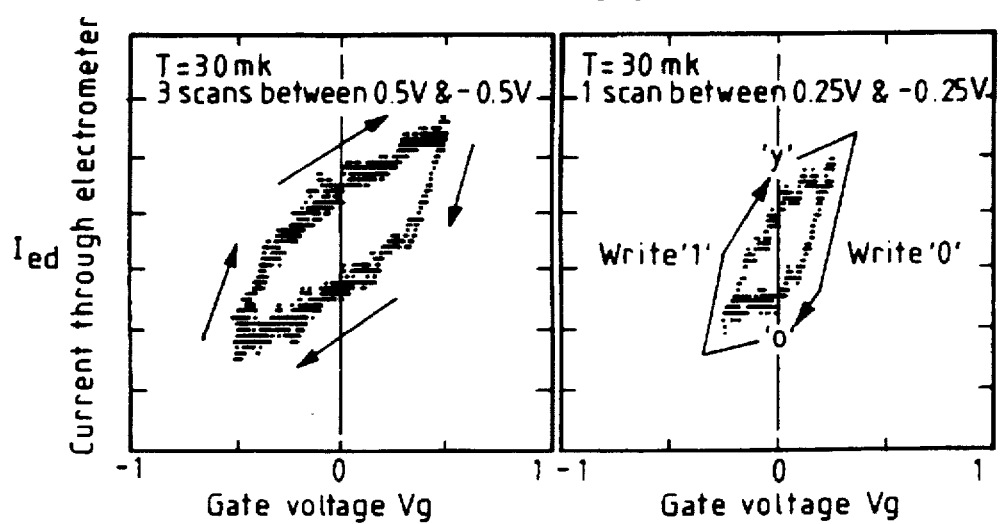
FIG. 30 illustrates graphs of memory operation characteristics of the device, showing hysteresis.

The memory cell characteristics are shown in FIG. 30, for three cycles of $V_g$ between 0.5 V and −0.5 V and for one cycle between 0.25 V and −0.25 V. Clear and reproducible hysteresis was observed. Thus, by using the gate voltage $V_g$ as a write voltage, logic levels 1 and 0 can be written onto the memory node 32.

From a rough estimation of capacitance, C=10 aF, $C_g=C_s=1$ fF by the previously mentioned characterisation of MTJ1, so it can be determined that the upper and the lower branches of the graphs shown in FIG. 30 at zero gate voltage $V_g=0$ correspond to ±100 electrons. A step-like characteristic in the measured curves indicates the entrance and exit of single electrons at the node 32.

Thus, a single-electron memory cell is provided using side-gated structures in a δ-doped layer. In the experimental structure shown in FIG. 29, one bit of information is represented by ±n electron number states with n≈100. It is possible to reduce the number of electrons and represent the binary code with a single electron, for example, by redesigning capacitor $C_g$. The number of electrons used has a bearing on the maximum storage time that can be achieved, as will be discussed hereinafter.

The described device operates at low temperatures, typically 1K. However, if the structure is made at a scale of less than 5 nm, the memory is operable at room temperature.

Examples of arrays of memory cells in accordance with the invention will now be described, in which the cells can be addressed individually for reading and writing operations. In the example of the invention shown in FIG. 29, the memory node 32 is switchable between its two memory states by varying the gate voltage $V_g$. However, it is also possible to switch the memory node by use of the side gate voltage $V_{sg}$ or a combination of the gate voltage $V_g$ and the voltage $V_{sg}$ applied to the side gate 38 of MTJ1.

An example of an array of memory cells that operates in this way, will be described with reference to FIG. 31. The configuration comprises a rectangular array of memory cells $M_{nm}$, which in this example is shown schematically as a 3×3 array arranged in rows and columns. The cell $M_{00}$ will be considered in detail by way of example; all of the other memory cells are operated in the same way. The circuit of the cell $M_{00}$ is substantially the same as that described in reference to FIG. 26 and comprises a memory node 32 with a gate capacitor $C_g$ and a multiple tunnel junction MTJ1 having a side gate 38. The voltage of the memory node 32 is detected by electrometer MTJ3.

Particular memory cells are selected on a row and column basis and thus memory cell $M_{00}$ is written with information by means of a write-word line $W_W$ that is connected to the side gates 38 of each memory cell in a particular row, and by means of a write-bit line $B_W$ connected to the gate capacitors $C_g$ of each memory cell in a particular column. Data is written into the memory node 32 of memory cell $M_{00}$ when a write pulse is applied concurrently to the write-bit line $B_W$ and the write-word line $W_W$ connected to the cell.

In order to explain the writing operation, reference will now be made to FIGS. 32 and 33. In FIG. 32a, a MTJ is shown schematically comprising multiple tunnel junctions connected between a source s and a drain d, and having a side gate 38 that receives a side gate voltage $V_{sg}$. The source-drain voltage/current characteristic is shown in FIG. 32b, for two different values of gate voltage $V_{sga}$, $V_{sgb}$, where $V_{sgb} > V_{sga}$. As previously explained, the multiple tunnel junction MTJ exhibits Coulomb Blockade such that for a range of voltages:

$$-Q_c/C < V < Q_c/C \qquad (7)$$

This can be restated as:

$$-V_c < V < V_c \qquad (8)$$

Referring to FIG. 32b, it can be seen that the voltage-current characteristic is such that the current increases with applied voltage, except in the Coulomb Blockade region $-V_c < V < V_c$ where no current flows. The width of the Coulomb Blockade region can be controlled by the voltage applied to the side gate 38. This is illustrated schematically by the two curves for gate voltages $V_{sga}$ and $V_{sgb}$, which respectively give rise to Coulomb Blockade regions of 2 $V_{cl}$ and 2 $V_{ch}$.

FIG. 33a shows a graph of the voltage v of the memory node 32 as a function of applied gate voltage $V_g$ (in a manner corresponding to the graph of FIG. 27) with the side gate voltage $V_{sg}$ set to a value which produces a relatively high Coulomb Blockade threshold $V_{ch}$, whereas FIG. 33b shows a corresponding situation when the Coulomb Blockade voltage is set to a lower value $V_{cl}$. As previously explained, a number of quantized electron states can occur at the memory node 32, which are plotted as a series of dotted lines in FIG. 27, although these electron states cannot exist when the gate $V_g$ is varied in an attempt to take the memory node voltage V beyond the Coulomb Blockade limit $V_c$.

Figure 34:
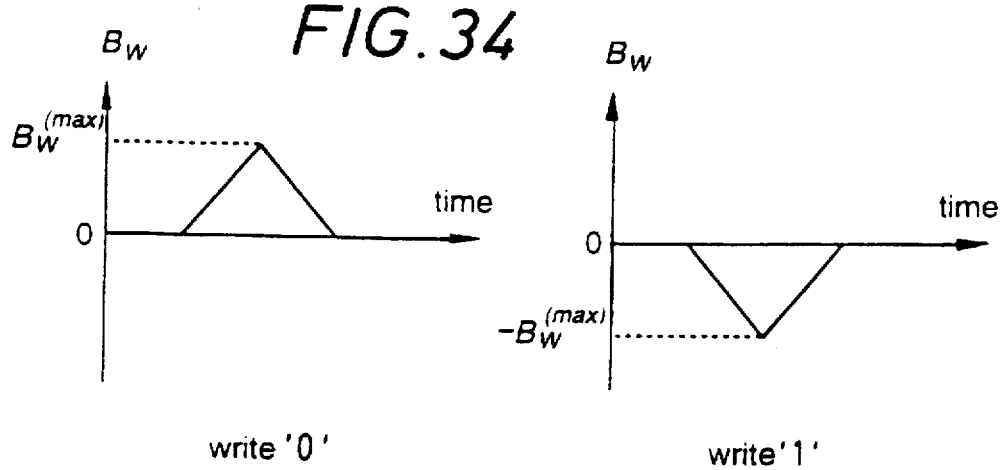
FIG. 34 illustrates positive and negative going write pulses $\pm B_W$ (max)

In FIG. 33a and 33b, the characteristics for electron states at n=−2→n=+2 are shown. In order to write information into the memory cell $M_{00}$, the write-bit line $B_W$ receives either a 0 or a 1 write pulse $B_W$ (max) or $-B_W$ (max), as shown in FIG. 34. These pulses are applied to the gate capacitor $C_g$ and thus can alter the gate voltage $V_g$ between upper and lower limits $V_{gu}$, $V_{gl}$ as shown in FIG. 33.

Considering now the situation shown in FIG. 33a, in which the Coulomb Blockade voltage $V_c$ is set to a high value $V_{ch}$, i.e. when the write-word line $W_W$ is not enabled. In this case, if a write pulse $\pm B_W$ (max) is applied to the gate capacitor $C_g$ none of the electron states n=−2~n=+2 are dragged either above or below the Coulomb Blockade limit $\pm V_{ch}$ and therefore, the electron states existing at memory node 32 remain intact for the range n=−2~n=+2.

However, when the write-word line $W_W$ is enabled so that the Coulomb Blockade voltage threshold $\pm V_c$ is set to the lower limit $\pm V_{cl}$, data can be written into the memory cell, as can be seen from FIG. 33b. In this case, when the write-bit line $B_W$ receives a "write 1" pulse $-B_W$ (max) the characteristics of all of the electron states that exist when $V_g=0$, are dragged below the Coulomb Blockade threshold $-V_{cl}$, apart from the electron state n=−2. Therefore, only the electron state n=−2 can remain, which can be used to represent binary data=1.

Similarly, when a "write 0" pulse $+B_W$ (max) is applied, the electron states which exist at $V_g=0$ are dragged upwardly such that at $+B_W$ (max) only the electron state n=+2 can exist, because the characteristics of the other states have extended above the upper Coulomb Blockade threshold limit $V_{cl}$ and hence have been destroyed. Thus, only one electron state n=+2 remains in the cell, which can be used to represent binary 0.

Thus, binary 1 or 0 can be selectively written into the memory cell by enabling an appropriate row of the memory cells and then applying an appropriate "write 1" or "write 0" pulse to a corresponding write-bit line $B_W$. In the foregoing example, the electron states n=±2 are used to represent binary 1 and 0. However, it will be appreciated that other electron number states could be used.

It can be shown that a suitable value of the write pulses $B_W$ can be defined as follows:

$$(V_{ch}-V_{cl})\Sigma C/C_g > B_W(\text{max}) > 2\, V_{cl}\, \Sigma C/C_g \qquad (9)$$

In order to read information from a particular memory cell, the electrometer MTJ3 for the cell needs to be enabled.

Figure 31:
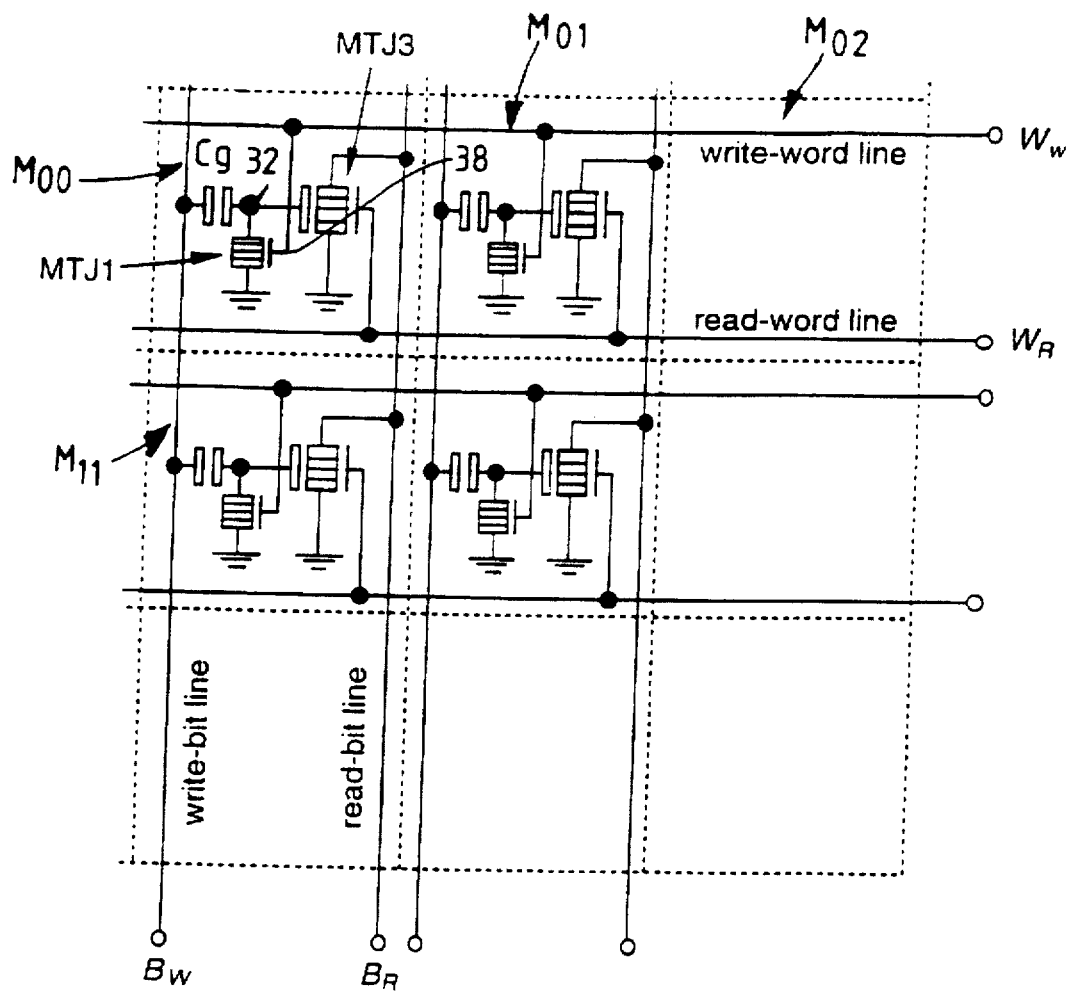
FIG. 31 illustrates an array of memory cells arranged in row and columns.

Referring to FIG. 31, this is achieved by concurrently applying an enabling voltage to a read-word line $W_R$ and a read-bit line $B_R$. In this way, the memory cell $M_{00}$ has its electrometer MTJ3 selectively enabled so that an output current indicative of the binary state of the memory node 2 is produced on the read-bit line $B_R$. Appropriate output circuitry (not shown) may be used in a manner known per se to process the output from the read-bit lines $B_R$.

Thus, in use, a particular row of the memory cell array can be selected by enabling the read-word line $W_R$ associated with the row and the state of the various cells in the row can be determined from the outputs of the individual read-bit lines $B_R$.

Figure 35:
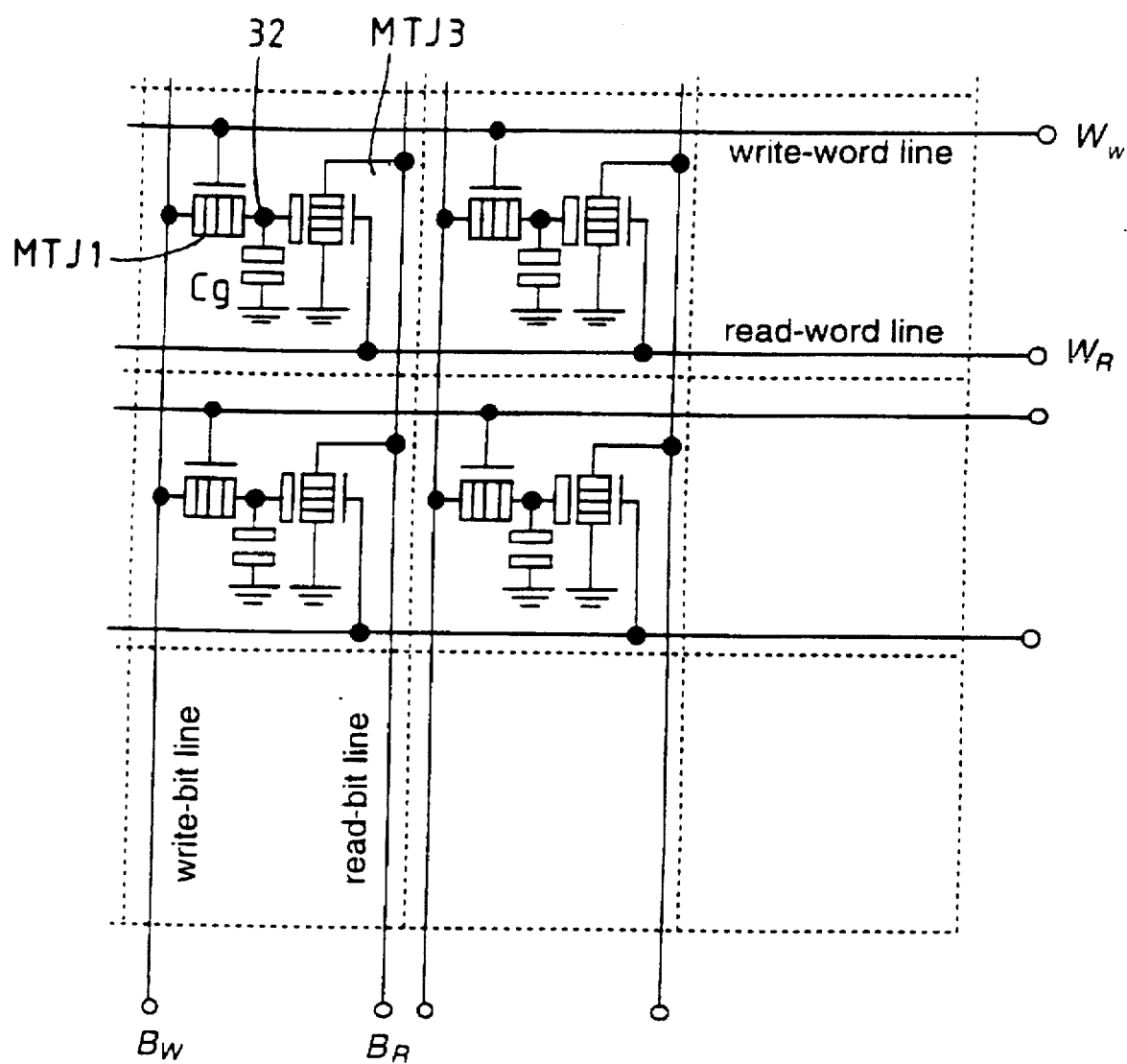
FIG. 35 illustrates an alternative memory cell array.

Another example of the memory cell is shown in FIG. 35 in which like components are given the same reference numbers as in FIG. 31. The connection of the memory cell is slightly different; the device MTJ1 is connected between the write-bit line $B_W$ and the memory node 32 instead of the gate capacitor $C_g$ which instead is connected to earth. The operation of the array is similar to that of FIG. 31.

Figure 36:
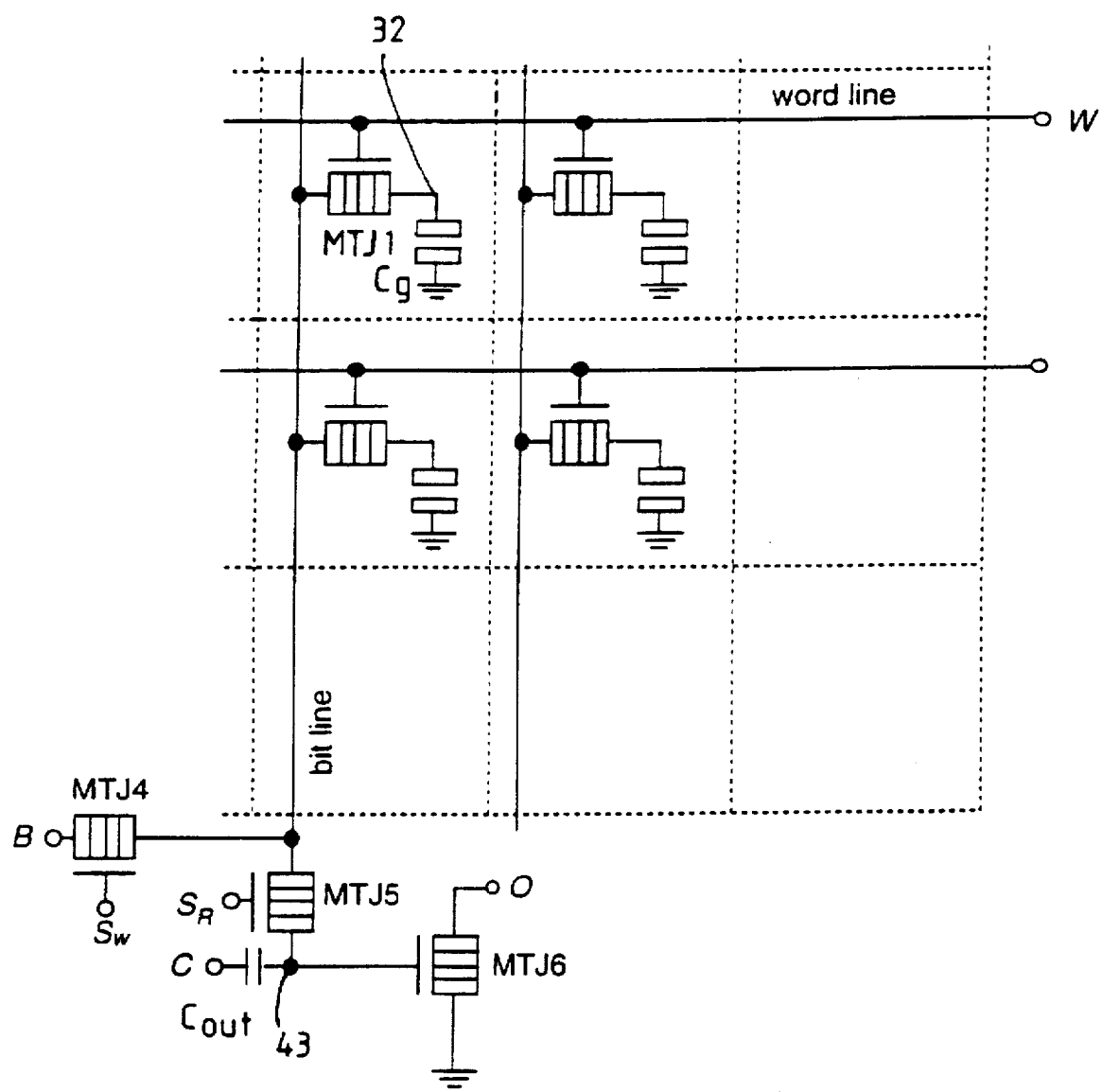
FIG. 36 illustrates yet a further memory cell array, with a common output electrometer for each column.

In the memory cells shown in FIG. 31 and 35, an individual electrometer MTJ3 is provided in each memory cell, the electrometers being associated with read-word lines and read-bit lines $W_R$, $B_R$. However, as shown in FIG. 36, it is possible to use a single electrometer with each column of the array rather than include an electrometer in each memory cell, which substantially simplifies the structure. Thus, associated with each row and column is an individual bit line B and word line W. Associated with each bit line is a sequence of side gated multiple tunnel junction devices MTJ4-6, connected as shown. In order to write information into a particular cell, a suitable word line W is enabled for the cell concerned so as to apply a suitable side gate voltage to MTJ1. Additionally, MTJ4 is opened by applying a side gate voltage $S_W$ to its side gate so that a write-bit bias B can be applied to the bit line, the bias B having a value corresponding to binary 1 or 0, so as to set the electron state of memory node 32 to define binary 1 or 0, in the manner previously described with reference to FIGS. 31 to 35.

In order to read information from the cell, the word line is again enabled. Additionally, a switching voltage $S_R$ is applied to the side gate of MTJ 5 to open the device and a clocking waveform C is applied to the bit line through a capacitor $C_{out}$. As a result, electrons are transferred from the memory node 32 to output node 43, depending upon the electron state of the memory node 32. The electron state of the output node 43 is connected to the side gate of MTJ6 so as to provide an output on the source/drain path thereof.

Figure 37:
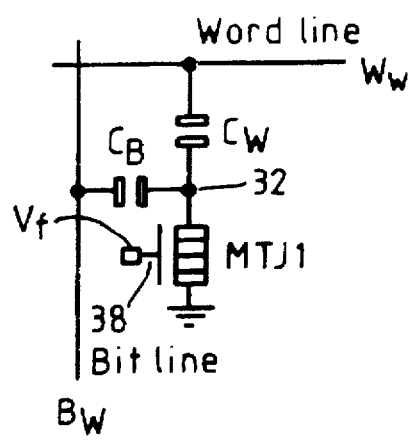
FIG. 37 is a partial schematic diagram of a further version of the memory cell in which a fixed side gate voltage is applied to MTJ1.

An alternative configuration for the memory cell is shown in FIG. 37. Only the part of the cell necessary to achieve writing is shown and the reading arrangement, for example MTJ3 and its associated connections are omitted for the purpose of clarity. The memory cell includes the multiple tunnel junction device MTJ1, which, in this case, has its side gate 8 connected to receive a fixed voltage $V_f$ from a source not shown. The memory node 32 is connected to word-line $W_W$ and bit-line $B_W$ by respective word and bit capacitors $C_W$ and $C_B$, as shown.

Figure 38A:
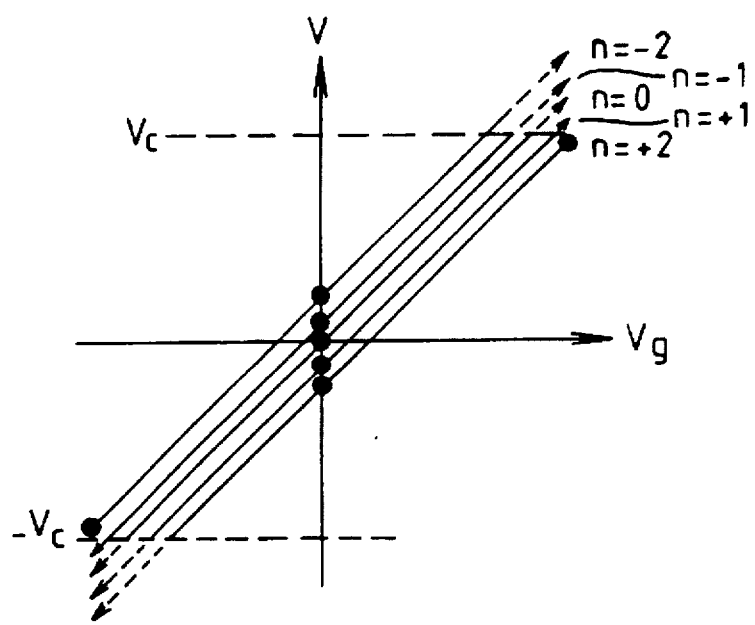
FIGS. 38A–38B is a graph of memory node voltage V versus applied gate voltage $V_g$ to illustrate writing of date in the cell of FIG. 37.

FIG. 38a and b illustrates a process for writing data into the memory cell. It will be appreciated that the gate voltage applied to the memory cell results from a combination of the voltages applied to the word line $W_W$ and the bit line $B_W$. When appropriate voltages are applied to both of the lines, information is written into the cell whereas if an enabling voltage is applied to only one of the line, information in the cell is not changed.

Referring to FIG. 38a, this illustrates a graph of the memory node voltage V versus the gate voltage $V_g$. The upper and lower Coulomb Blockade limit voltages $V_c$ are shown by dotted lines. It will be appreciated that $V_c$ is fixed for this memory cell due to the fixed gate voltage $V_f$ applied to gate 38. Thus, at zero gate voltage, a number of stable electron states $+n^- -n$ can occur at the memory node 32, for which the states $1 \rightarrow \bar{n}$ represent binary code 1 whereas states $1 \rightarrow -n$ represent binary 0. In FIG. 38, $|n|=2$ by way of example. In FIG. 38a, when information is written into the cell, an enabling voltage is applied to both the word line $W_W$ and the bit line $B_W$, which results in a relatively large negative going gate voltage $V_g$ given as follows: $V_g=C_bV_b + C_WV_W$. This relatively large gate voltage drags the characteristic of each of the electron states, apart from state $-n$, below the Coulomb Blockade threshold $-V_c$. Thus, only the state $-n$ can exist and therefore binary 1 has been written into the cell. If enabling pulses of opposite sign are applied to the word line $W_W$ and the bit line $B_W$ simultaneously, the electron states that exist at $V_g=0$ are dragged upwardly towards the upper Coulomb Blockade threshold $V_c$, such that only the electron state $+n$ can exist, the other states having been destroyed by the operation of the Coulomb Blockade threshold. In this way binary 0 can be written into the cell. The gate voltage $V_g$ is then returned to 0 and as a result, either binary 1 or 0 has been written into the memory cell.

Figure 38B:
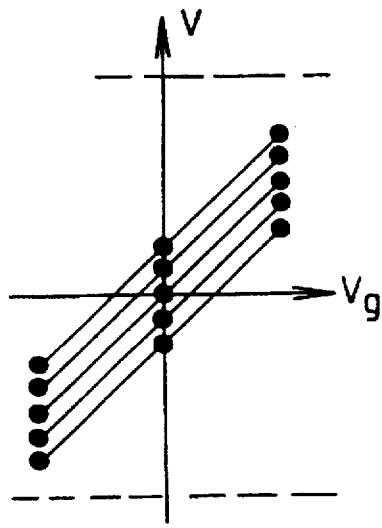

Referring to FIG. 38b this shows the situation when only one of the word or bit lines $W_W$ or $B_W$ receive an enabling pulse. The electron states are shifted from the voltage values at $V_g=0$ but they are not shifted either above or below the threshold voltages $\pm V_c$ so that none of the electron states are destroyed and hence information is not written into the cell.

The relationship between the write voltages $V_W$ and $V_B$ that are applied to the word and bit lines to achieve the writing of data can be summarised as follows $$C_W V_W + C_B V_B + ne \leq -\Sigma C V_c \quad (10)$$

$$-\Sigma C\, V_c \leq C_W V_W ne \quad (11)$$

$$-\Sigma C\, V_c \leq C_B V_B ne \quad (12)$$

Figure 39:
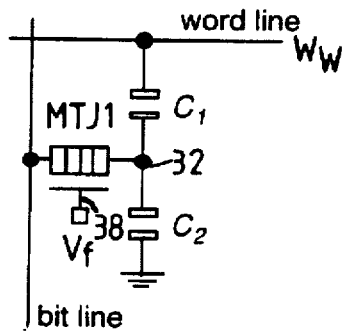
FIG. 39 is a schematic circuit diagram of part of yet another version of the memory cell.

Another modification is shown in FIG. 39, in which the multiple tunnel junction device MTJ1 is provided with a fixed side-gate voltage $V_f$, having its source drain path connected between the bit line $W_B$ and the memory node 32, which, in turn is connected between the word line $W_W$ and ground by series capacitors $C_1$, $C_2$ which act as gate capacitors.

Figures 40A, 40B, 40C:
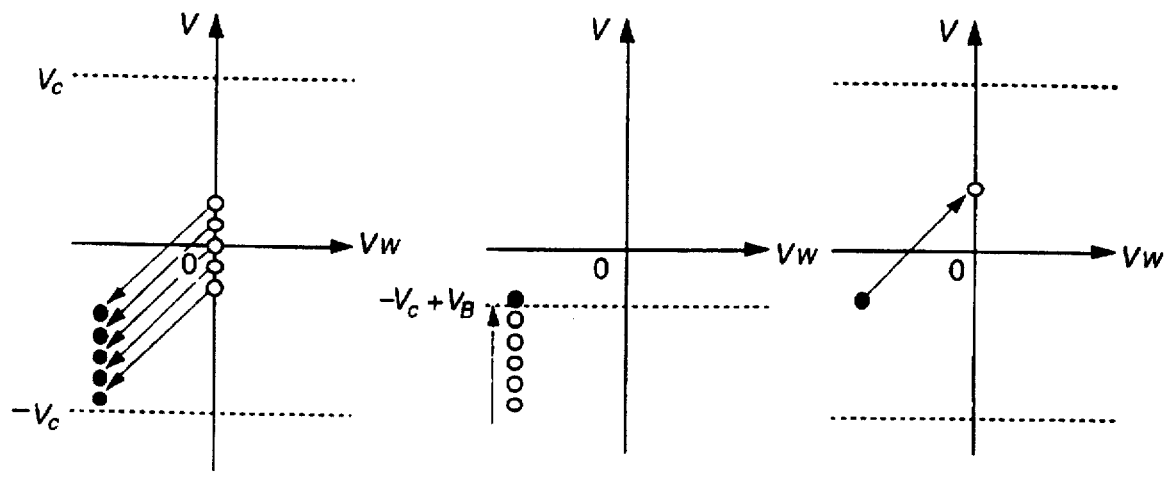
FIG. 40 illustrates the writing of binary data 1 into the memory cell of FIG. 39.

The manner in which a binary 1 can be written into the memory cell of FIG. 39 will now be described with reference to FIG. 40. Prior to the writing process, the word and bit lines are kept at ground level and during the write process, they receive respective bias voltages $V_B$ and $V_W$ on the bit and word lines respectively. FIGS. 40a, b and c show successive stages in the writing process. FIG. 40 illustrates the voltage V of the memory node 32 as a function of $V_W$ (which corresponds to $V_g$ of the previous FIGS.). In FIG. 40, white circles illustrate permitted electron states before the step and black circles illustrate the electron states after the step.

Referring to FIG. 40a when a negative voltage $V_W$ is applied to the word line the electron states are shifted negatively but all of the states remain stable since they are not dragged below the lower Coulomb Blockade threshold $-V_c$. In a second step shown in FIG. 40b, a positive going voltage $V_B$ is applied to the bit line $W_B$ and as a result, all of the electron states, apart the uppermost state $-n$, is destroyed thereby writing data into the memory cell. The word and bit lines are then returned to zero voltage as shown in FIG. 40c, as a result of which only one electron state, representing binary 1 remains in the cell. It will be appreciated that by applying inverse voltages to the word and bit lines, a corresponding writing of binary 0 can be achieved so as to destroy all electron states apart from state +n.

Figure 41:
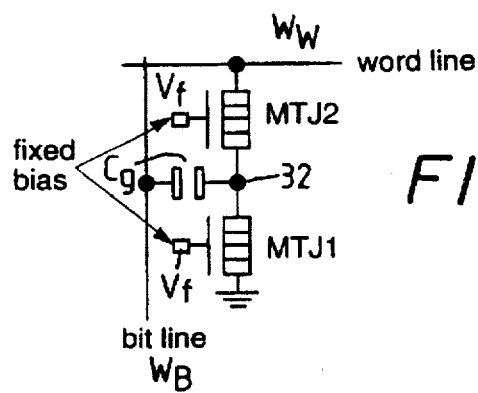
FIG. 41 is a circuit diagram of yet another modification to the memory cell.

Yet another memory cell configuration is shown in FIG. 41. This includes two multi-tunnel junction devices MTJ1, MTJ2 connected in series between the word line $W_W$, the memory node 2 and ground, the gate capacitance $C_g$ being connected between the bit line $W_B$ and the memory node. Data is written into the cell in the same manner as described with reference to FIGS. 39 and 40.

Figure 42:
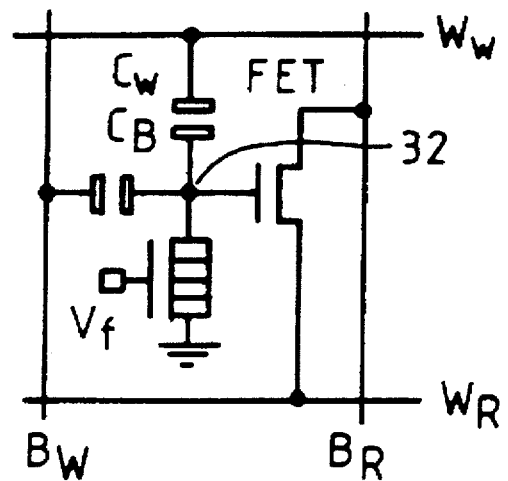
FIG. 42 illustrates a memory cell in which the electrometer is replaced by a field effect transistor (FET)

As previously stated, the arrangements for reading the cells shown in FIGS. 37, 39 and 41 have been omitted and it is possible to include an electrometer MTJ3 as described with reference to FIGS. 31 and 35 in each memory cell. As an alternative, a field effect transistor (FET) can be used to detect the electron state of the memory node 32, as shown in FIG. 42, which shows a development of FIG. 37 with a FET for detecting the electron state of the memory node 32.

Also, a common electrometer configuration as shown in FIG. 36 can be used with any of the foregoing cells.

Figure 43:
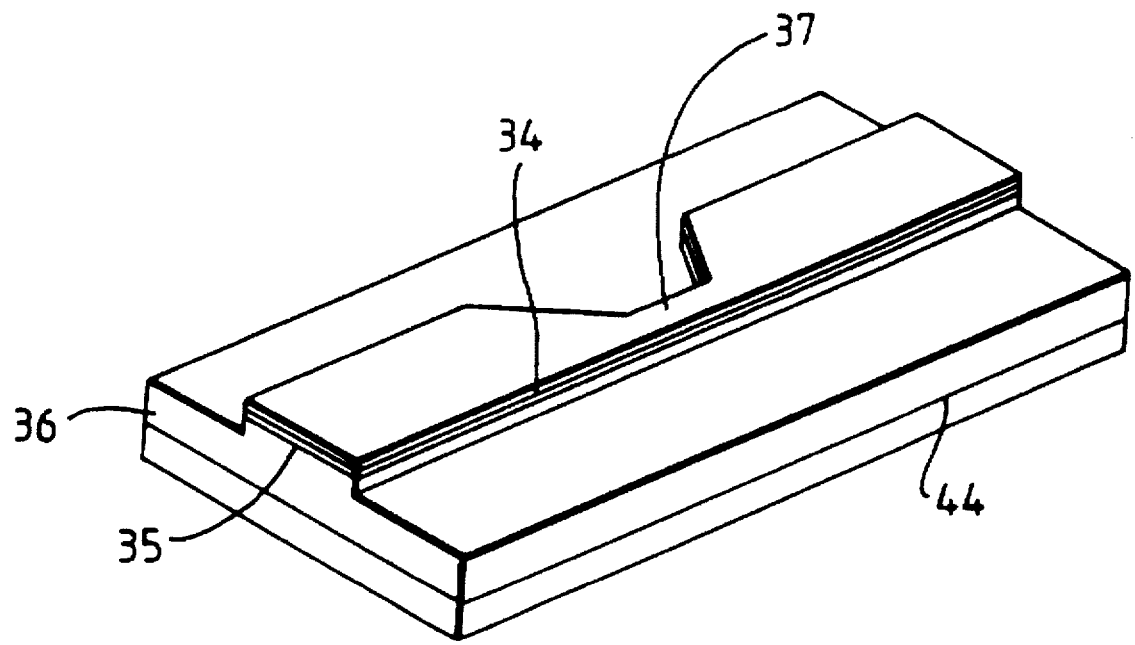
FIG. 43 illustrates an alternative form of the δ-doped layer with a gate formed in the substrate.

Considering now the physical structure of the MTJs, the previously described examples are produced by selective etching of a δ-doped layer. However many modifications and variations are possible. For example, as shown in FIG. 43, the side gate for the MTJ need not necessarily be formed from a spaced portion of the δ-doped layer. Instead, the side gate may comprise an underlying conductive layer, for example doped layer 44 shown in FIG. 43.

Furthermore, the MTJ need not necessarily be constructed from a δ-doped layer as previously described. Other configurations are possible and an alternative method of producing variable-resistance tunnel junctions is to use a split-gate method with modulation-doped structures as described in Kouwenhoven, L. P., Johnson, A. T., van der Vaart, N. C., van der Enden, A., Harmans, C. J. P. M. and Foxon, C. T.,: "Quantised current in a quantum dot turnstile", Z. Phys. B—Condensed Matter, 1991, 85, pp 381–388. However, the δ-doped structure has several advantages with respect to split-gate structures. Firstly, the stray capacitance $C_s$ can be reduced because the material surrounding the memory node is etched away, resulting in reduced capacitance, which is important for the control of the multi-stability factor $\Delta$ given by equation (2). Secondly, the depletion regions become small due to the high carrier concentration in the δ-doped layer, thereby reducing the device size. Thirdly, the same process can be used, without additional steps, to make a wide range of capacitors coupled to the channel 34. Fourthly, as previously discussed, it has been found that a single constriction 37 results in the formation of several tunnel junctions, possibly because of the formation of tunnel barriers by impurities, and this is convenient for realising the memory structure and for reducing co-tunnelling effects.

Figure 44:
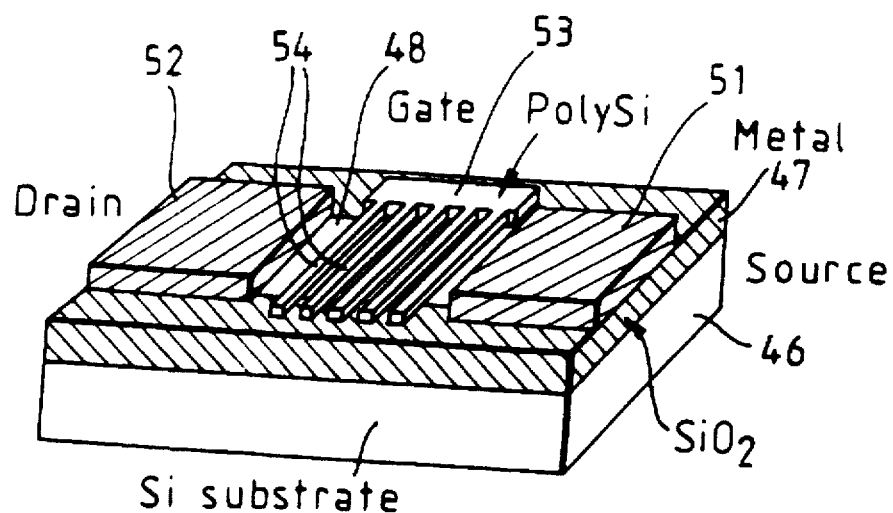
FIG. 44 is a schematic perspective view of another form of multiple tunnel junction device, formed on a silicon substrate.
Figure 45:
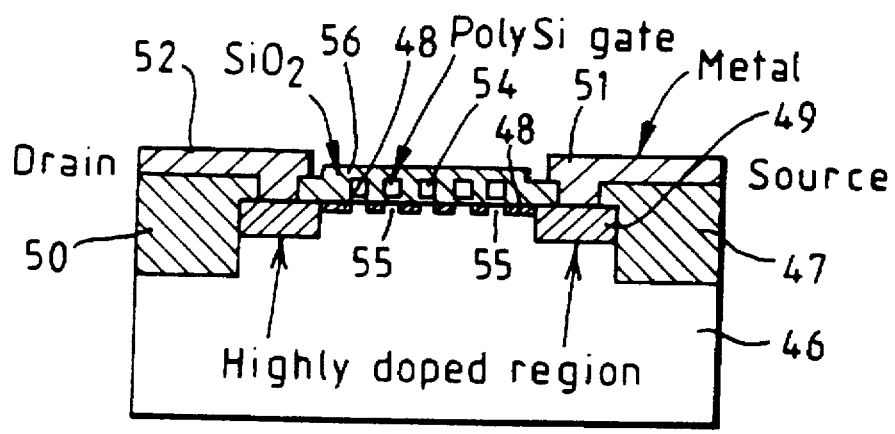
FIG. 45 is a longitudinal section through the device of FIG. 44.

Some alternative MTJ structures will now be described. Referring to FIG. 44 and 45, there is shown a silicon implemented structure which is in general terms similar to a conventional MOS transistor structure, but with an inter-digitated side gate that gives rise to an MTJ structure. The device can conveniently be implemented using Si fabrication techniques although other fabrication technologies could be used. Referring to FIGS. 44 and 45, the MTJ comprises a Si substrate 46 with an $SiO_2$ overlayer 47 containing a conductive channel 48 that extends between highly doped source and drain regions 49, 50 provided with metallic contacts 51, 52. The channel is overlaid by a conductive polysilicon side gate 53 which includes a plurality of parallel spaced finger members or digitations 54 which may be defined by electron beam lithography and are separated from the channel by an insulating oxide region 56. In use, a voltage is applied to the gate 53 and the digitations 54 produce spaced depletion regions 55 in the channel 48. Thus, the channel includes alternating conductive and non-conductive portions between the source and drain regions 49, 50. The non-conductive depletion regions 55 constitute tunnelling barriers and it can be seen that electrically, the configuration is analogous to the multiple island arrangement shown in FIG. 28a, so that the device operates as an MTJ.

Figure 46:
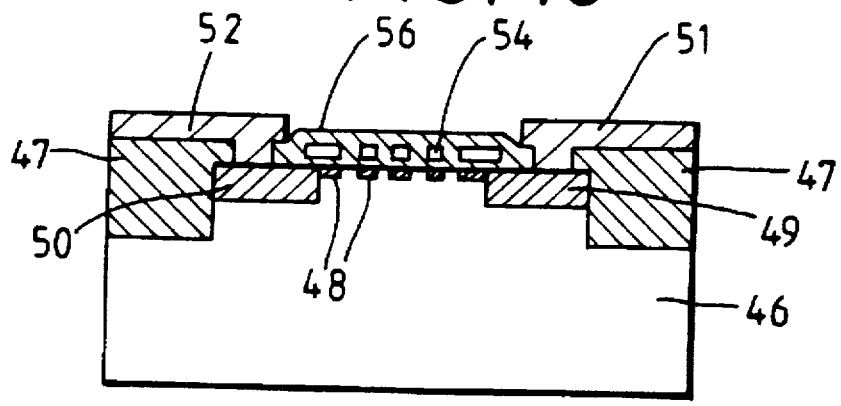
FIG. 46 corresponds to FIG. 45 illustrating a modification.

In a modification shown in FIG. 46, the doping profile is so arranged that conductive portions of the channel 48 are formed to underlie the polycrystaline silicon digitations 54 of the gate 53 and non conductive channel portions are provided between the digitations. Since the resulting channel comprises a sequence of conducting and non-conductive portions, the structure gives rise to multiple tunnel junctions arranged in series so as to provide the MTJ. The source, drain and channel regions may be formed by conventional lithographic techniques but the digitations 54 may be produced by electron beam lithography such that the digitations are typically of the order of 10 nm in width, with equal spacing. For appropriate electron beam techniques, reference is directed to W. Chen and H. Ahmed, Fabrication of 5–7 nm wide etched lines in silicon using 100 keV electron beam lithography and polymethylmethacrylate resist" Appl. Phys. Lett. vol. 62, p 1499, 1993.

Figure 47:
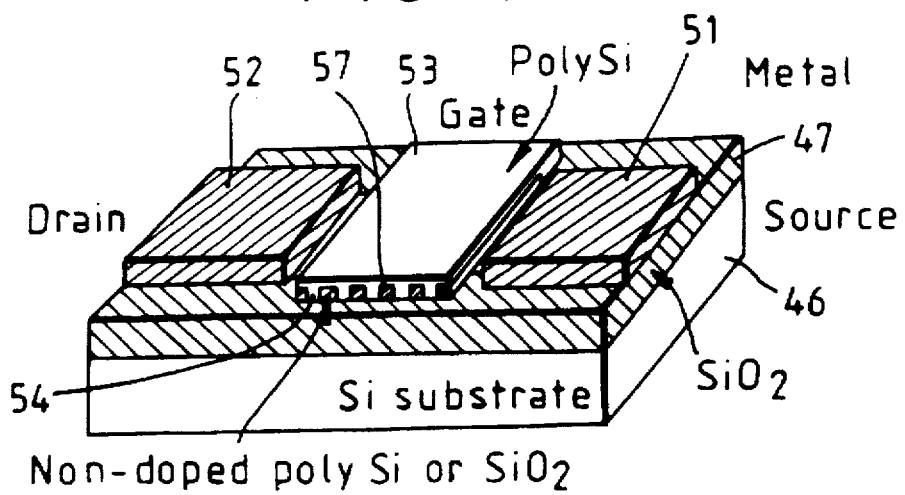
FIG. 47 illustrates a further form of multiple tunnel junction device, which comprises a modification of the arrangement shown in FIG. 44.
Figure 48:
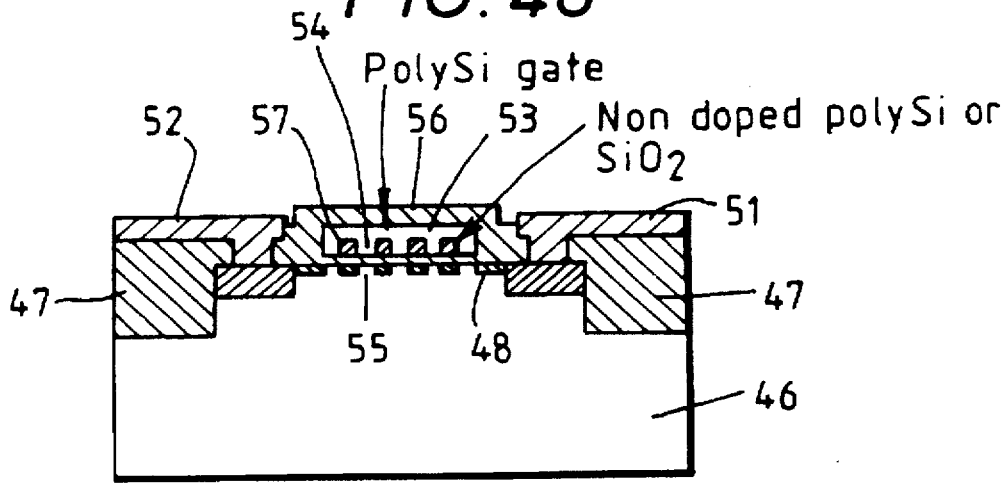
FIG. 48 is a section through the device of FIG. 47.

Referring now to FIGS. 47 and 48, this shows a modification in which the digitations are produced by firstly laying stripes of non-doped polysilicon or silicon dioxide over the channel and then forming a polysilicon gate which overlies the stripes. The effect is to spatially modulate the conductivity of the channel to provide non-conducting portions 55 thereby to produce the MTJ, as can be seen clearly in the cross section of FIG. 48.

Figure 49:
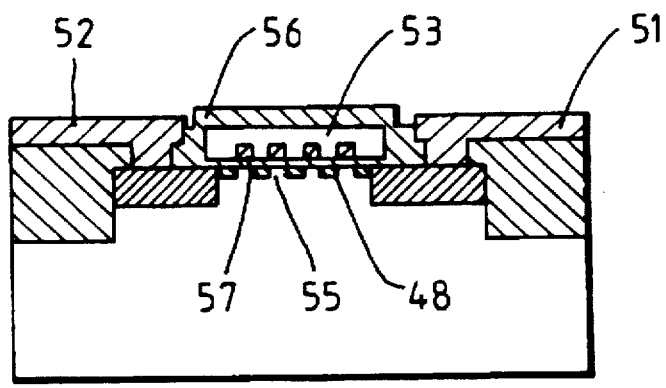
FIG. 49 is a section, corresponding to FIG. 48, showing a modification.

A modification to FIG. 48 is shown in FIG. 49 in which the dopant concentrations are so arranged that the depletion regions occur underneath the polysilicon stripes 57 rather than under the digitations 54.

Figure 50:
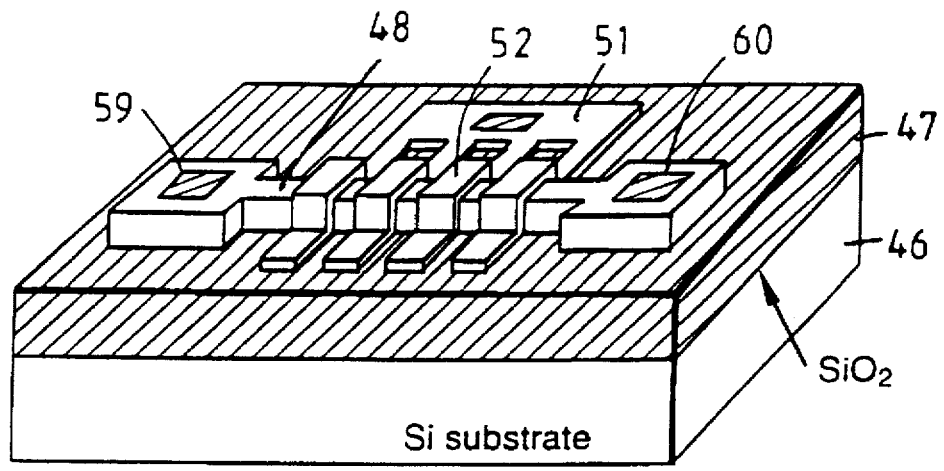
FIG. 50 illustrates a further version of a silicon-implemented multiple tunnel junction device.
Figure 51:
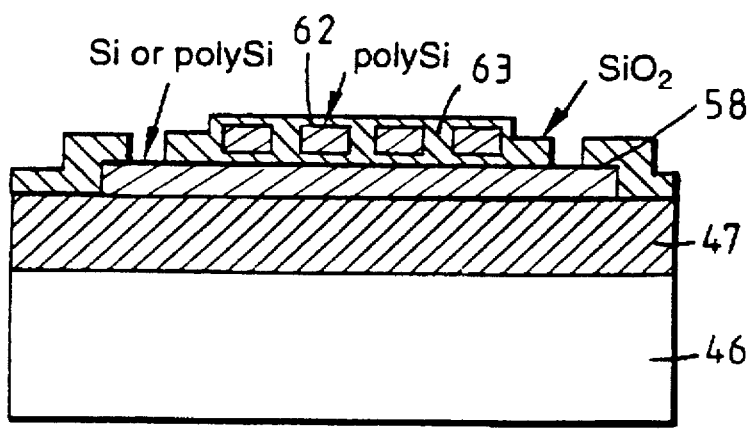
FIG. 51 is a section through the device of FIG. 50.

Yet another structure is shown in FIGS. 50 and 51, in which polysilicon or doped silicon is provided as a channel, overlying an insulating $SiO_2$ layer. This structure is resistant to soft errors produced by α particles creating electron-hole pairs in the semiconductor. The device consists of a silicon substrate 46 with an $SiO_2$ overlayer 47 on which is formed an overlying channel 58 of polysilicon or appropriately doped conductive silicon and provided with source and drain contacts 59, 60. A gate 61 provided with digitations 62 of polysilicon, insulated from the channel 58 by a $SiO_2$ layer 63 (FIG. 51), produces a series of spaced depletion regions along the channel thereby to provide the MTJ structure. This arrangement can be seen from FIG. 51 which is a section along the length of the channel.

Figure 52:
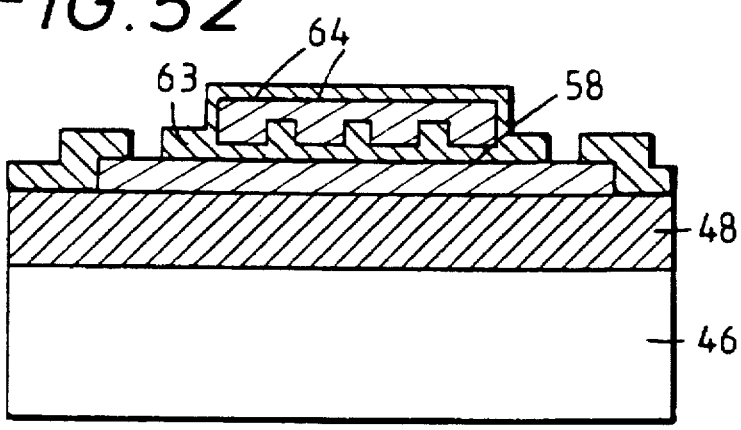
FIG. 52 is a section, corresponding to FIG. 51, illustrating a modification.

A modification is shown in FIG. 52 in which the overlying gate is provided with a ribbed configuration 64 to produce the effect provided by the digitations 62 of FIGS. 50 and 51.

Figures 53A, 53B, 53C, 53D:
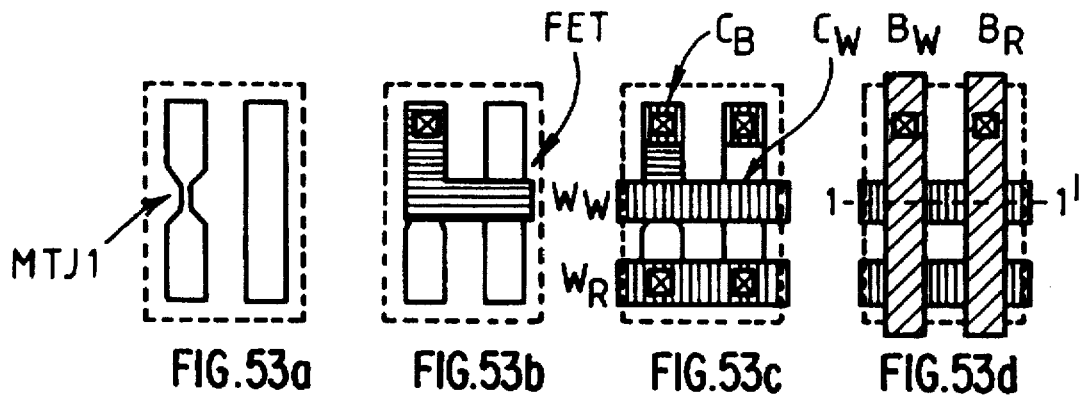
FIGS. 53a–d illustrate plan views from the bottom to top layer of an example of a memory cell in accordance with the invention, which uses a planar multiple tunnel junction device.
Figure 53E:
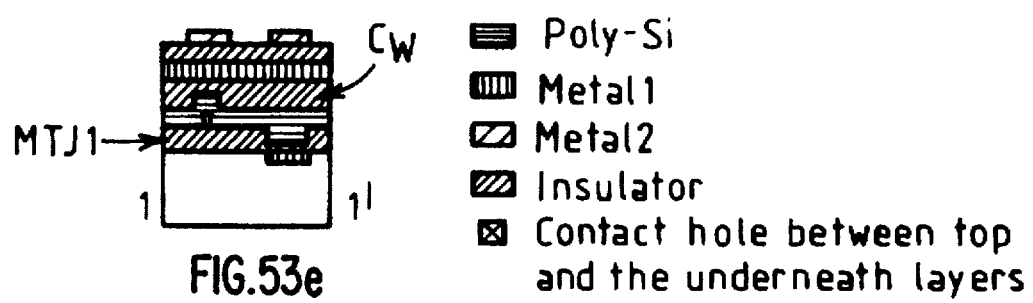
FIG. 53e is a sectional view along I–I' shown in FIG. 53d.

Referring now to FIG. 53, this illustrates schematically a memory cell corresponding to the circuit diagram of FIG. 42, constructed using Si fabrication techniques. FIGS. 53a–d are plan views from the bottom to the top layer of the device, which is shown in section in FIG. 53e. A key to the various materials is shown in the drawings. MTJ1 is constituted by a constriction shown on the left hand side of FIGS. 53a. The FET is constituted by a MOS transistor on the right side of FIG. 53a. Capacitors $C_W$ and $C_B$ are constituted by between the poly-Si and metal 1. The fixed voltage $V_f$ is applied to MTJ1 through the substrate. The ground level to the MTJ1 is connected to the read-word line $W_R$. The various read and write lines $W_W$, $W_R$, $B_W$ and $B_R$ are shown in the drawings.

Figures 54A, 54B, 54C, 54D:
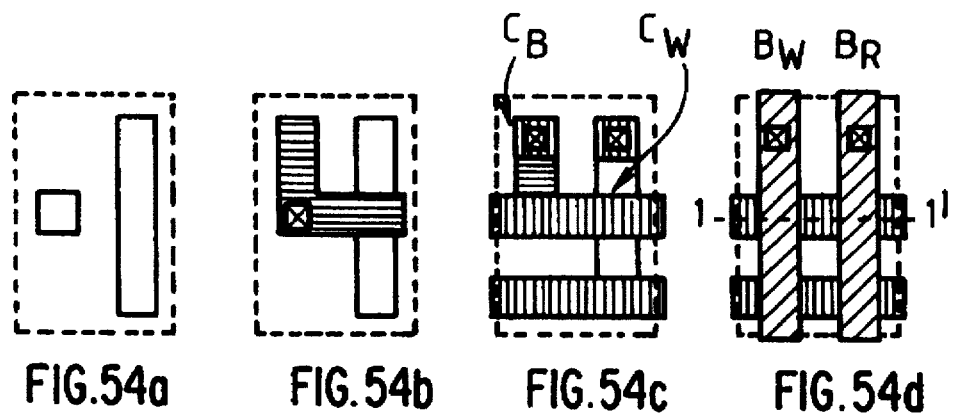
FIGS. 54A–54E corresponds to FIGS. 53A–respectively, but shows a vertically structured multiple tunnel junction device.
Figure 54E:
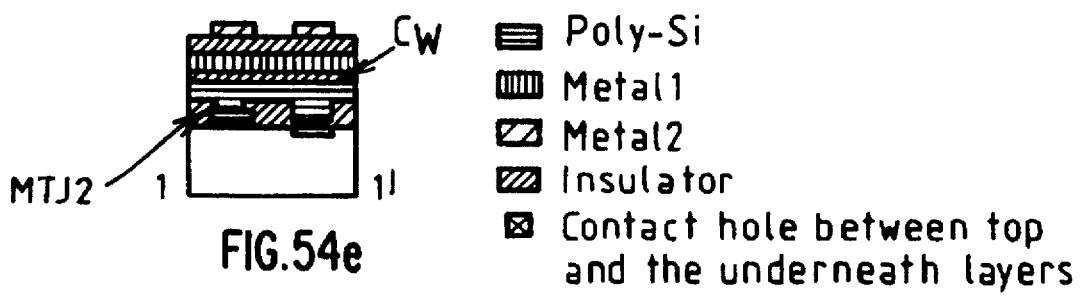

In FIG. 54, a similar configuration is shown in which the MTJ is constituted by a vertical structure. As example of a vertical multi-layered MTJ is described in British Patent Application 9320665.4 filed on 15th Oct. 1993 (publication No. 2284299.

Figure 55:
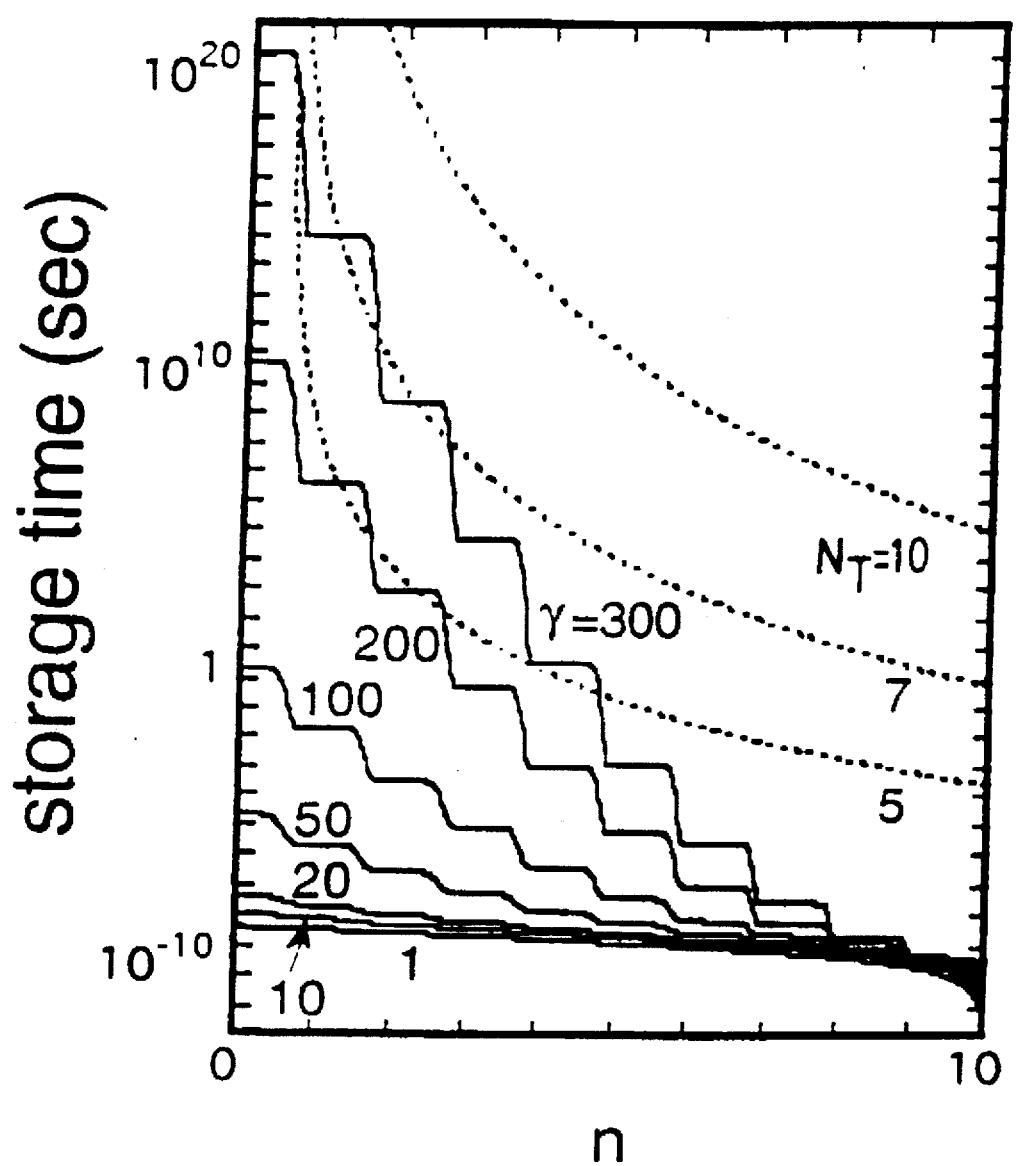
FIG. 55 is a graph of the storage time versus electron state characteristics of the memory node shown in FIG. 29.

The required operating conditions for the MTJ will now be considered. From the experiments using the device in FIG. 29, the device parameters were obtained and the storage time is presented in FIG. 55 based on these parameters. The measured storage time was also explained by this calculation. In FIG. 55, the solid lines show the intrinsic storage time with a parameter $\gamma$ given by $e^2/(2Ck_BT)$, where $k_B$ is the Boltzmann constant and T is the temperature. The dotted lines show co-tunnelling time, and $N_T$ is the number of tunnel junctions in the MTJ. The maximum number of electrons in Coulomb Blockade region, $n_{max}$, is 10 in this case. Near $n_{max}$, storage time is relatively short, but a storage time longer than 1 sec is obtained when $n=n_{max}/4$, $\gamma \geq 200$, and $N \geq 5$. At room temperature, this condition implies that the capacitance of the MTJ should be lower than 0.02 aF, and the number of tunnel junctions in the MTJ is preferably larger than 5.

Conventional high density semiconductor memory is mainly dynamic random access memory (DRAM). However, the information in DRAM must be refreshed constantly and therefore consumes the electric power. To avoid this problem, static random access memory (SRAM) is often used instead of DRAM in mobile computers in which power consumption is one of the key items of performance, although the memory capacity is low and the price is expensive because the memory cell structure is complicated in SRAM.

When a future DRAM with higher memory capacity is envisaged the power consumption becomes larger and in the worst case it will not operate. For current designs of DRAM cell (16 Mbit memory), the storage time t is 1 msec and information must be refreshed within this storage time. Since only one row of memory cells can be refreshed at a time, the refreshment of one cell must be finished within 250 nsec in the 16 Mbit case. If a 16 Gbit DRAM is considered, the situation becomes worse and it can be shown that the refreshment of one cell must be finished within 0.08 nsec. This is beyond the current operation speed of the peripheral circuits, for which, at present, the switching time is ~10 nsec. Even if the peripheral circuits can operate at the required speed, the power consumption will become extremely large.

In the present invention, the leakage current becomes extremely low and therefore the refreshment time can be longer than 100 sec, which has been demonstrated by the structure shown in FIG. 29. This longer storage reduces the frequency of refreshment and so the power consumption can approach that of a SRAM.

We claim:

1. A logic device comprising:

a charge storage node;

barrier means;

means for selectively controlling charge carriers passing through the barrier means to the node during a predetermined period, the amount of charge at the node being limited by Coulomb Blockade to thereby define first and second logical states; and output logic means for providing an output logic signal with different logical levels in response to said logical states of the node.

2. A logic device comprising:

a charge storage node;

barrier means;

clock means for selectively altering the probability of charge carriers passing through the barrier means to the node during a clocking period, the amount of charge at the node being limited by Coulomb Blockade to thereby define first and second logical states; and output logic means for providing an output logic signal with different logical levels in response to said logical states of the node.

3. A device according to claim 2 including logic control means coupled to said clock means for applying a potential to the node to control whether a charge carrier passes through the barrier to the node during the clocking period, to thereby control the logical state of the node.

4. A device according to claim 2 including a first and a second of said charge storage nodes and a first and a second of said barrier means, the first barrier means being coupled to the first node, and the second barrier means being coupled between first and second nodes, said clocking means including means for cyclicly raising and lowering the probability of charge passing through the barrier means respectively whereby to permit charge to enter the first node through the first barrier means, and to permit charge from the first node to pass through the second barrier means to the second node.

5. A device according to claim 4 including at least one further barrier means and node serially connected to said second node so that said nodes and said barrier means are serially connected in a line.

6. A device according to claim 5 including a plurality of said lines.

7. A device according to claim 6 including means for coupling at least one node of one of the lines to the other of the lines.

8. A device according to claim 2 including a logical unit comprising said node and at least a further node, and means for transferring the logical state of said unit to another thereof.

9. A device according to claim 8 including a Coulomb electrometer for detecting the state of at least one of said nodes.

10. A device according to claim 8 wherein the clock means, includes means for providing a plurality of clocking waveforms to respective nodes of each logic unit.

11. A device according to claim 10 wherein the means for providing a plurality of clocking wave forms includes a transmission line.

12. A device according to claim 2 wherein the barrier means comprises at least one tunnel junction.

13. A device according to claim 2 wherein said barrier means comprises first and second tunnel diodes connected in series.

14. A device according to claim 1 wherein the barrier means comprises a multiple-tunnel junction.

15. A device according to claim 2 wherein said node comprises a conductive track formed on a substrate and said barrier means comprises a tunnel diode including a conductive channel overlying said track and spaced therefrom by an electrically insulating region.

16. A device according to claim 15 including at least one clock line overlying said track.

17. A memory device including a memory cell that comprises:

a memory node for storing charge;

means for providing a tunnel barrier configuration for charge carriers, in a region coupled to the memory node in such a manner that the node exhibits first and second quantized memory states for which the level of stored charge is limited by Coulomb Blockade;

gate means for producing a field in said region that controls the tunnel barrier configuration; and control means for controlling charge carrier tunnelling through the tunnel barrier configuration to produce a transition between the quantized states at the node.

18. A device according to claim 17 including capacitor means coupled to the memory node, the control means including means for applying a voltage across the capacitor means, for controlling charge tunnelling through the barrier means to produce said transition between quantized states at the node.

19. A device according to claim 17 wherein the control means includes means for controlling the field produced by the gate means, for controlling charge carrier tunnelling through the barrier means to produce said transition between quantized states at the node.

20. A device according to claim 17 including means for providing a further tunnel barrier configuration coupled to the memory node.

21. A device according to claim 20 including further gate means for producing a field that influences said further tunnel barrier configuration.

22. A device according to claim 17 including output means for providing a logical output signal in response to the memory state of the memory node.

23. A device according to claim 22 wherein the output means comprises an electrometer.

24. A device according to claim 17 including a plurality of the memory cells.

25. A device according to claim 24 wherein the memory cells are arranged in rows and columns, with a plurality of address lines associated with the rows and columns respectively, at least one said cell including first and second means responsive to predetermined combinations of control potentials on the address lines for a row and column associated with the cell, for individually switching the cell between said first and second states.

26. A device according to claim 25 wherein the cell includes a side gated MTJ with a source-drain path coupled to the memory node, means defining a gate capacitor coupled between the memory node and one of the column and row address lines associated with the cell, the side gate of the MTJ being coupled to the other of the address lines associated with the cell.

27. A device according to claim 25 wherein the cell includes a side gated MTJ with a source-drain path coupled to the memory node and one of the column and row address lines associated with the cell, the side gate of the MTJ being coupled to the other of the address lines associated with the cell, and means defining a gate capacitor coupled to the memory node.

28. A device according to claim 25 wherein the cell includes a side gated MTJ with a source-drain path coupled to the memory node, the side gate of the MTJ being coupled to a fixed voltage source, means defining a first gate capacitor coupled between the memory node and the column address line for the cell, and means defining a second gate capacitor coupled between the memory node and the row address line for the cell.

29. A device according to claim 25 wherein the cell includes a side gated MTJ with a source-drain path coupled to the memory node and one of the column and row address lines for the cell, the side gate of the MTJ being coupled to a fixed voltage source, means defining a gate capacitor coupled between the memory node and the other of the column and row address lines for the cell.

30. A device according to claim 25 wherein the cell includes first and second side gated MTJs each with a source-drain path coupled to the memory node and their side gates coupled to a fixed voltage source, the source-drain path of one of the MTJs being coupled to one of the column and row address lines associated with the cell, and means defining a gate capacitor coupled between the memory node and the other of the column and row address lines for the cell.

31. A device according to any one of claim 24 including an output means within each of the cells for providing a logical output signal in response to the memory state of the cells respectively.

32. A device according to claim 31 wherein each said output means comprises a device with a source-drain path and a gate coupled to the memory node, the array including column and row reading lines, the source-drain path of the output means being coupled between the column and row reading lines associated with the cell.

33. A device according to claim 32 wherein the output means comprises a side gated MTJ whereby the source-drain current thereof is modulated in dependence upon the memory state of the memory node.

34. A device according to claim 32 wherein the output means comprises a FET.

35. A device according to claim 32 including means for applying selective reading address signals to the reading lines to address the cells individually.

36. A device according to claim 17 wherein the means providing the tunnel barrier configuration includes a conductive channel that has been formed by selective etching and lithography from a δ-doped layer in a substrate, the channel including a region of constricted width which exhibits the characteristics of a MTJ.

37. A device according to claim 36 including side gate means adjacent the constricted region.

38. A device according to claim 37 wherein the side gate means comprises a portion of the delta doped layer, the portion being spaced from the channel.

39. A device according to claim 37 wherein the side gate means comprises a further conductive layer disposed vertically within the substrate.

40. A device according to claim 17 wherein the means for providing the tunnel barrier configuration comprises a source, a drain, a channel extending from the source to the drain, and a side gate that includes a plurality of regions which induce spaced depletion regions in the channel to provide said tunnel barrier configuration.

41. A device according to claim 40 wherein the gate regions comprise spaced digitations.

42. A device according to claim 40 wherein the gate regions comprise spaced gate thickness modulations.

43. A memory device including:

a memory node for storing charge;

means for providing a barrier configuration for charge carriers, coupled to the memory node, in such a manner that the node exhibits first and second quantized memory states for which the level of stored charge is limited by Coulomb Blockade; and control means for controlling charge carrier tunnelling through the barrier configuration to produce a transition between the quantized states at the node, including first and second means for applying respective control potentials to the barrier configuration, the node being switched between said first and second states in response to predetermined combinations of said control potentials.

44. A device according to claim 43 wherein the means for providing the barrier configuration includes a side gate.

45. A device according to claim 43 wherein the barrier configuration comprises a multiple tunnel junction device.

46. A memory device including:

a memory node for storing charge;

a plurality of tunnel Junction barriers, serially coupled to the memory node such that the node exhibits bistable quantized memory states for which the level of stored charge is limited by Coulomb Blockade; and control means for selectively controlling charge carrier tunnelling through a plurality of tunnel barriers to produce a transition between the bistable quantized states and the node.

47. A device according to claim 46 wherein the plurality of tunnel junction barriers comprises a multiple tunnel junction device.

48. A device according to claim 47 wherein the multiple tunnel device includes a side gate.

49. A device according to claim 46 including an electrometer for sensing the state of the memory node.

* * * * *

UNITED STATES PATENT AND TRADEMARK OFFICE
CERTIFICATE OF CORRECTION

PATENT NO. : 5,677,637
DATED : 14 October 1997
INVENTOR(S) : Kazuo NAKAZATO et al.

It is certified that error appears in the above-indentified patent and that said Letters Patent is hereby corrected as shown below:

| Column | Line | |
|---|---|---|
| 1 | 17 | Change "$10^{-5}$" to --$10^{-5}$--. |
| 1 | 24 | Change "$10^{-5}$" to --$10^{-5}$--. |
| 5 | 64 | Change "D12" to --D1 2--. |
| 9 | 29 | Change "Nakazto," to --Nakazato,--. |
| 11 | 33 | Change "$n \pm 2$," to --$n = \pm 2$,--. |
| 14 | 10 | Change "v" to --V--. |
| 14 | 16 | After "$V_{d}$." start new paragraph. |
| 16 | 7 | After "$|n|=2$" insert --,--. |
| 23 | 13 | Change "Junction" to -- junction--. |

Signed and Sealed this

Twenty-third Day of June, 1998

Attest:

BRUCE LEHMAN

Attesting Officer      Commissioner of Patents and Trademarks